US010381334B2

(12) United States Patent
Kang et al.

(10) Patent No.: US 10,381,334 B2
(45) Date of Patent: Aug. 13, 2019

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Hee-Won Kang, Hwaseong-si (KR); Jong-Joo Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/787,434

(22) Filed: Oct. 18, 2017

(65) Prior Publication Data
US 2018/0130781 A1 May 10, 2018

(30) Foreign Application Priority Data

Nov. 4, 2016 (KR) .................. 10-2016-0146471

(51) Int. Cl.
H01L 23/00 (2006.01)
H01L 23/48 (2006.01)
(Continued)

(52) U.S. Cl.
CPC .............. *H01L 25/18* (2013.01); *H01L 24/48* (2013.01); *H01L 24/49* (2013.01); *H01L 24/73* (2013.01);
(Continued)

(58) Field of Classification Search
CPC ....... H01L 2224/73265; H01L 25/0657; H01L 25/105; H01L 25/18; H01L 25/50; H01L 25/0655; H01L 25/0652; H01L 25/16; H01L 23/3128; H01L 23/562; H01L 29/945; H01L 27/0811; H01L 24/16; H01L 24/17; H01L 24/48; H01L 24/49; H01L 24/13; H01L 24/32; H01L 24/73; H01L 2924/00014; H01L 2924/3511; H01L 2924/15313; H01L 2924/15331;
(Continued)

(56) References Cited

U.S. PATENT DOCUMENTS 6,165,814 A 12/2000 Wark et al.
7,091,607 B2 8/2006 Liu
(Continued)

FOREIGN PATENT DOCUMENTS

JP 2006-253576 A 9/2006
KR 10-1191075 B1 10/2012

*Primary Examiner* — Natalia A Gondarenko
(74) *Attorney, Agent, or Firm* — Muir Patent Law, PLLC

(57) ABSTRACT

A semiconductor package includes a package substrate having an upper surface and a lower surface and including a plurality of substrate pads formed on the upper surface, a capacitor structure arranged on the upper surface of the package substrate and including a semiconductor substrate and at least one decoupling capacitor formed in the upper surface of the semiconductor substrate, a plurality of first semiconductor chips mounted on the package and supported by the capacitor structure, first conductive connection members electrically connecting chip pads of the first semiconductor chips to the substrate pads, and second conductive connection members electrically connecting capacitor pads of the decoupling capacitor to the substrate pad.

13 Claims, 18 Drawing Sheets

(51) Int. Cl.
*H01L 23/50* (2006.01)
*H01L 23/58* (2006.01)
*H01L 25/16* (2006.01)
*H01L 25/18* (2006.01)
*H01L 25/065* (2006.01)
*H01L 29/92* (2006.01)
*H01L 25/00* (2006.01)
*H01L 21/00* (2006.01)
*H01L 27/08* (2006.01)
*H01L 29/94* (2006.01)

(52) U.S. Cl.
CPC .......... *H01L 25/0652* (2013.01); *H01L 25/16* (2013.01); *H01L 25/50* (2013.01); *H01L 27/0811* (2013.01); *H01L 29/945* (2013.01); *H01L 2224/04042* (2013.01); *H01L 2224/05554* (2013.01); *H01L 2224/32145* (2013.01); *H01L 2224/32225* (2013.01); *H01L 2224/32265* (2013.01); *H01L 2224/48091* (2013.01); *H01L 2224/48106* (2013.01); *H01L 2224/48108* (2013.01); *H01L 2224/48145* (2013.01); *H01L 2224/48227* (2013.01); *H01L 2224/49109* (2013.01); *H01L 2224/49112* (2013.01); *H01L 2224/49175* (2013.01); *H01L 2224/49176* (2013.01); *H01L 2224/73265* (2013.01); *H01L 2224/92247* (2013.01); *H01L 2225/0651* (2013.01); *H01L 2225/06506* (2013.01); *H01L 2225/06562* (2013.01); *H01L 2924/00014* (2013.01); *H01L 2924/1431* (2013.01); *H01L 2924/1434* (2013.01); *H01L 2924/15192* (2013.01); *H01L 2924/15311* (2013.01); *H01L 2924/181* (2013.01); *H01L 2924/19041* (2013.01); *H01L 2924/19103* (2013.01); *H01L 2924/19105* (2013.01); *H01L 2924/19107* (2013.01)

(58) Field of Classification Search
CPC ... H01L 2924/1815; H01L 2924/19043; H01L 2224/13025; H01L 2224/48227; H01L 2224/73253; H01L 2224/17181; H01L 2224/16227; H01L 2224/16146; H01L 2224/49176; H01L 2225/0651; H01L 2225/06506; H01L 2225/06586; H01L 2225/06562; H01L 2225/06589; H01L 2225/1082; H01L 2924/19105; H01L 2924/19103; H01L 2924/19041; H01L 2924/15192; H01L 2924/1434; H01L 2924/1431; H01L 2924/19107; H01L 2924/181; H01L 2924/15311; H01L 2224/32225; H01L 2224/32145; H01L 2224/04042; H01L 2224/92247; H01L 2224/32265; H01L 2224/49175; H01L 2224/05554; H01L 2224/48106; H01L 2224/73204; H01L 2224/48145; H01L 2224/48091; H01L 2224/48108; H01L 2224/49109; H01L 2224/49112; H01L 2225/06513; H01L 2225/1058; H01L 2225/1023; H01L 2225/06565; H01L 2225/06517; H01L 2225/06541; H01L 2225/1088; H01L 2225/1094

USPC ......... 257/296, 532, 777, E23.141, E27.048, 257/724, 659, 686, 666, 668, 676, 916; 333/177, 181

See application file for complete search history.

(56) References Cited

U.S. PATENT DOCUMENTS

| | | | |
|---|---|---|---|
| 7,489,035 B2 | 2/2009 | Song et al. | |
| 8,304,881 B1 | 11/2012 | Haba et al. | |
| 8,674,494 B2 | 3/2014 | Nam et al. | |
| 8,796,861 B2 | 8/2014 | Kim et al. | |
| 9,190,396 B2 | 11/2015 | Shinh et al. | |
| 2005/0200003 A1 | 9/2005 | Yoon et al. | |
| 2006/0113679 A1 | 6/2006 | Takatsu et al. | |
| 2007/0007643 A1 | 1/2007 | Oh et al. | |
| 2009/0057860 A1* | 3/2009 | Bae | H01L 23/13 257/680 |
| 2009/0166839 A1 | 7/2009 | Suzuki et al. | |
| 2009/0290282 A1* | 11/2009 | Knickerbocker | H01G 4/232 361/306.2 |
| 2010/0164084 A1* | 7/2010 | Lee | H01G 4/232 257/686 |
| 2011/0089553 A1 | 4/2011 | Kim et al. | |
| 2013/0056882 A1* | 3/2013 | Kim | H01L 23/16 257/777 |
| 2013/0257564 A1* | 10/2013 | Huang | H01L 23/147 333/177 |
| 2014/0167291 A1* | 6/2014 | Nam | H01L 24/97 257/777 |
| 2015/0221624 A1 | 8/2015 | Ye et al. | |
| 2016/0071810 A1 | 3/2016 | Park | |
| 2016/0155729 A1* | 6/2016 | Fogal | H01L 25/18 257/713 |

* cited by examiner

US 10,381,334 B2

SEMICONDUCTOR PACKAGE AND METHOD OF MANUFACTURING THE SEMICONDUCTOR PACKAGE

PRIORITY STATEMENT

This application claims the benefit of priority under 35 U.S.C. § 119 to Korean Patent Application No. 10-2016-0146471, filed on Nov. 4, 2016, in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a multi-chip package including a decoupling capacitor and a method of manufacturing the semiconductor package.

2. Description of the Related Art

In a multi-chip package such as eMCP (Embedded Multi Chip Package), a decoupling capacitor may be mounted to reduce effects of undesirable simultaneous switching noise (SSN), such as a voltage drop induced in power distribution when multiple output drivers switch simultaneously in the package. However, a conventional bulk type of capacitor mounted in a semiconductor package may increase the entire thickness and area of the semiconductor package, and wirings connected to the capacitor may increase inductance, thereby deteriorating reliability of the semiconductor package.

SUMMARY

Example embodiments provide a semiconductor package capable of reducing the entire size and improving electrical performance of the semiconductor package.

In some embodiments, the disclosure is directed to a semiconductor package, comprising: a package substrate having an upper surface and a lower surface and including a plurality of substrate pads formed on the upper surface; a capacitor structure arranged on the upper surface of the package substrate and including a semiconductor substrate and at least one decoupling capacitor formed in an upper region of the semiconductor substrate; a plurality of first semiconductor chips mounted on the package substrate and supported by the capacitor structure; first conductive connection members electrically connecting chip pads of the first semiconductor chips to the plurality of substrate pads; and second conductive connection members electrically connecting capacitor pads of the decoupling capacitor to the plurality of substrate pads.

In some embodiments, the disclosure is directed to a semiconductor package, comprising: a package substrate; a first semiconductor chip mounted on the package substrate; a capacitor structure arranged on the package substrate to be spaced apart from the first semiconductor chip and including a semiconductor substrate and at least one decoupling capacitor formed in an upper surface of the semiconductor substrate; a plurality of second semiconductor chips mounted on the package substrate and supported by the capacitor structure; and conductive connection members electrically connecting capacitor pads of the decoupling capacitor to a substrate pad of the package substrate.

In some embodiments, the disclosure is directed to a semiconductor package, comprising: a package substrate having an upper surface and including a plurality of substrate pads formed on the upper surface; a capacitor structure arranged on the upper surface of the package substrate and including a semiconductor substrate and at least one decoupling capacitor formed in an upper surface of the semiconductor substrate; a first semiconductor chip mounted on the package substrate to be spaced apart from the capacitor structure; a plurality of second semiconductor chips mounted on the package substrate and supported by the capacitor structure and the first semiconductor chip; first conductive connection members electrically connecting first chip pads of the first semiconductor chips to the plurality of substrate pads; second conductive connection members electrically connecting second chip pads of the plurality of second semiconductor chips to the plurality of substrate pads; and third conductive connection members electrically connecting capacitor pads of the decoupling capacitor to the plurality of substrate pads.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is a plan view illustrating the exemplary semiconductor package in FIG. 1.

FIG. 3 is a plan view illustrating a capacitor structure of the exemplary semiconductor package in FIG. 1.

FIGS. 4 to 6 are cross-sectional views illustrating various exemplary types of silicon chip capacitors of the capacitor structure in FIG. 3.

FIGS. 7 to 11 are views illustrating a method of manufacturing a semiconductor package in accordance with example embodiments.

FIG. 12 is a plan view illustrating a capacitor structure of a semiconductor package in accordance with example embodiments.

FIG. 13 is a plan view illustrating a package substrate of the exemplary semiconductor package in FIG. 12.

FIG. 14 is a plan view illustrating a capacitor structure of a semiconductor package in accordance with example embodiments.

FIG. 15 is a plan view illustrating a package substrate of the exemplary semiconductor package in FIG. 14.

FIG. 16 is a plan view illustrating a semiconductor package in accordance with example embodiments.

FIG. 17 is a cross-sectional view illustrating a semiconductor package in accordance with example embodiments.

FIG. 18 is a cross-sectional view illustrating a capacitor structure and a first semiconductor chip on a package substrate of the exemplary semiconductor package in FIG. 17.

FIG. 19 is a plan view illustrating the exemplary capacitor structure in FIG. 18.

FIG. 20 is a cross-sectional view illustrating a semiconductor package in accordance with example embodiments.

DETAILED DESCRIPTION OF EXAMPLE EMBODIMENTS

Figure 1:
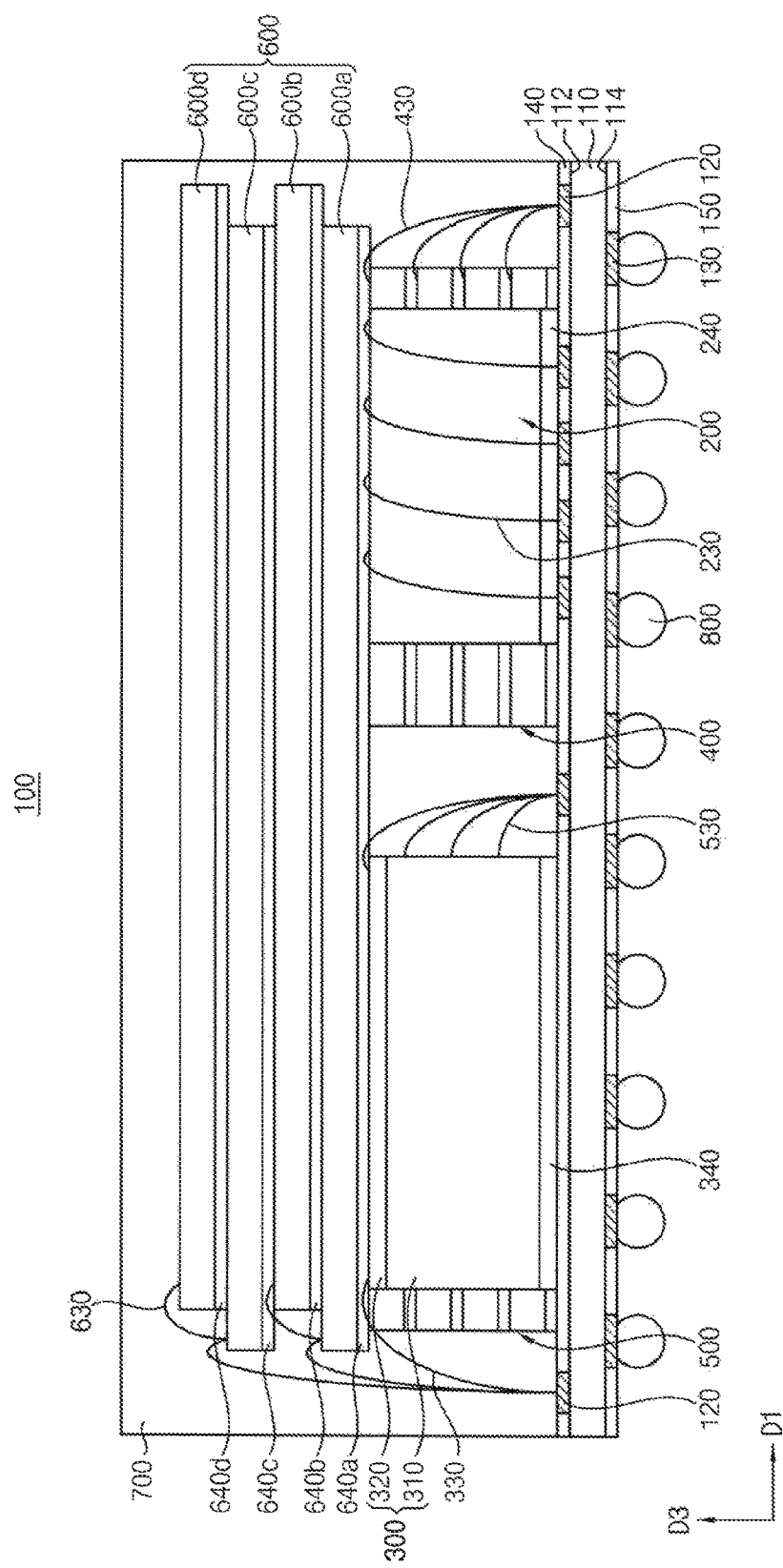
FIGS. 1 to 20 represent non-limiting, example embodiments as described herein.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. The various pads described herein may be connected to internal circuitry within the device to which they are connected, and may transmit signals and/or voltage to and/or from the device to which they are attached.

The semiconductor devices described herein embodied as an electronic device, such as a semiconductor memory chip or semiconductor logic chip, a stack of such chips, a semiconductor package including a package substrate and one or more semiconductor chips, a package-on-package device, or a semiconductor memory module, for example. The semiconductor devices described herein may be embodied as a volatile or non-volatile memory. A chip or package that includes such semiconductor devices may also be referred to generally as a semiconductor device.

Figure 2:
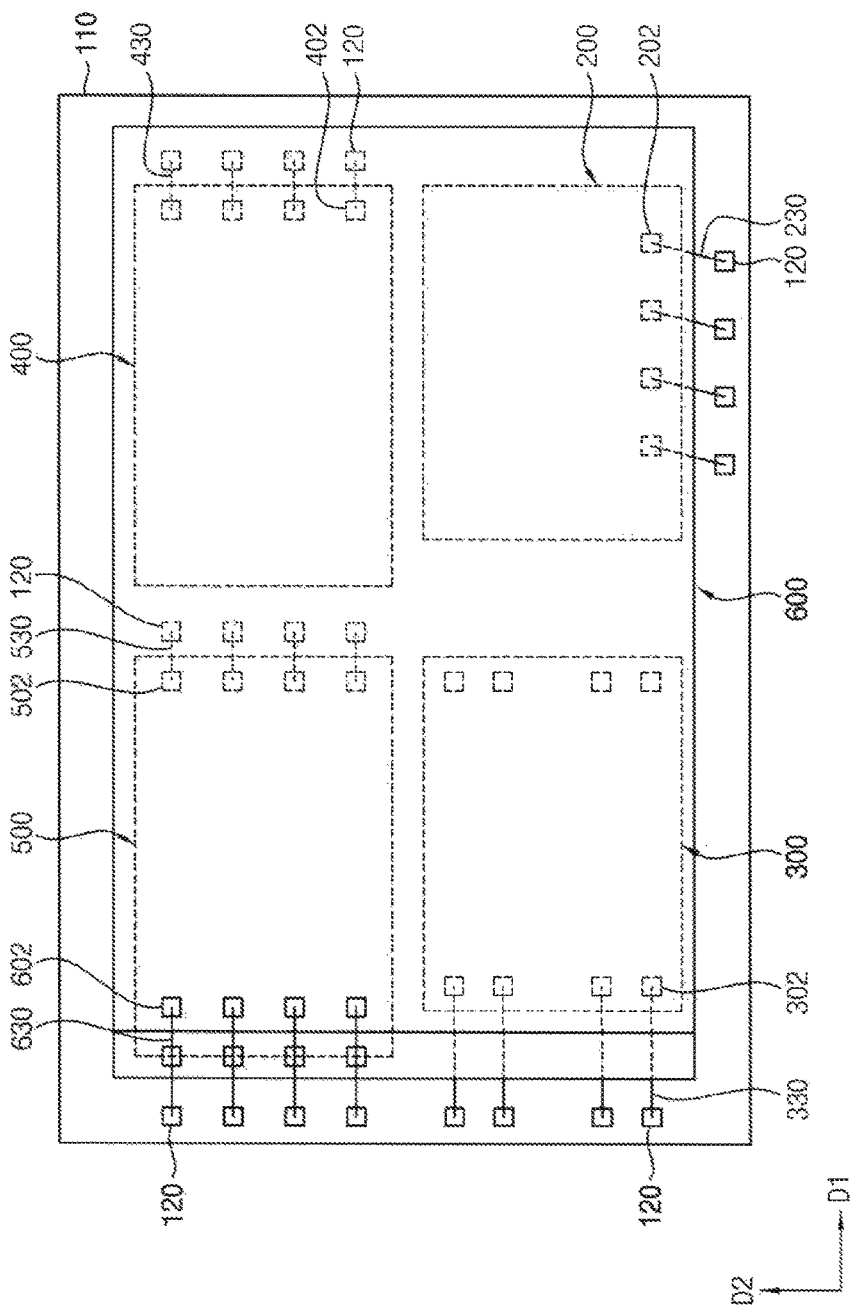
Figure 3:
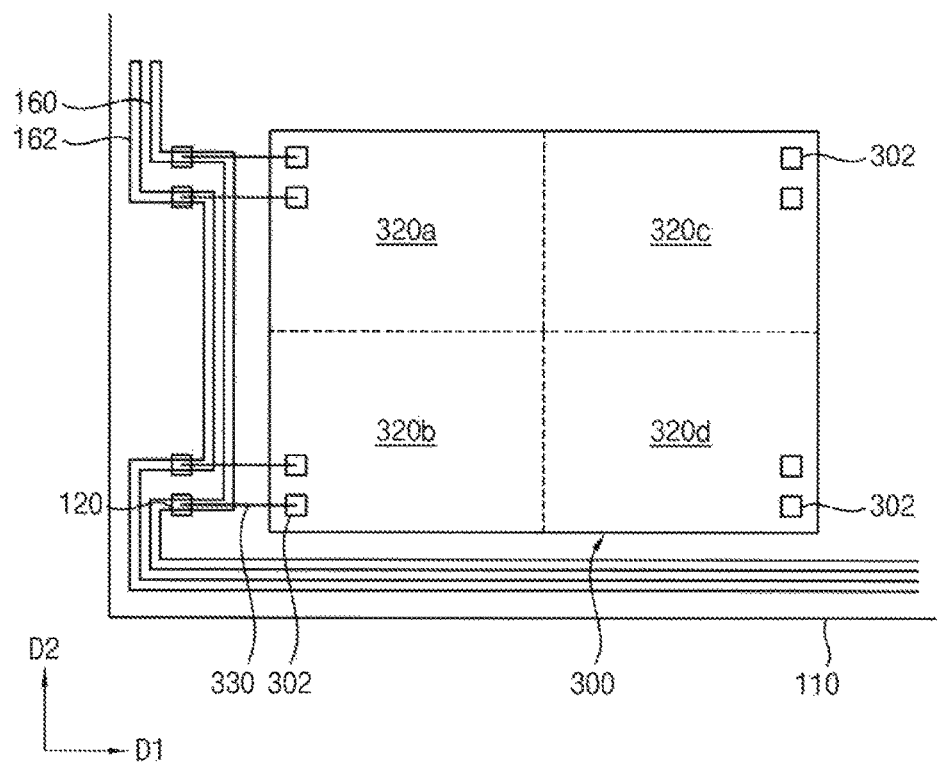
Figure 4:
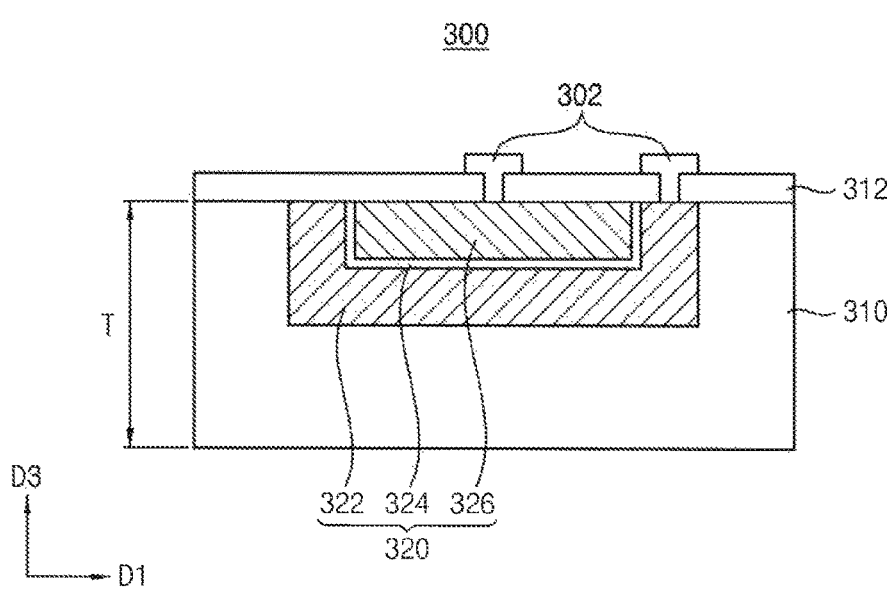
Figure 5:
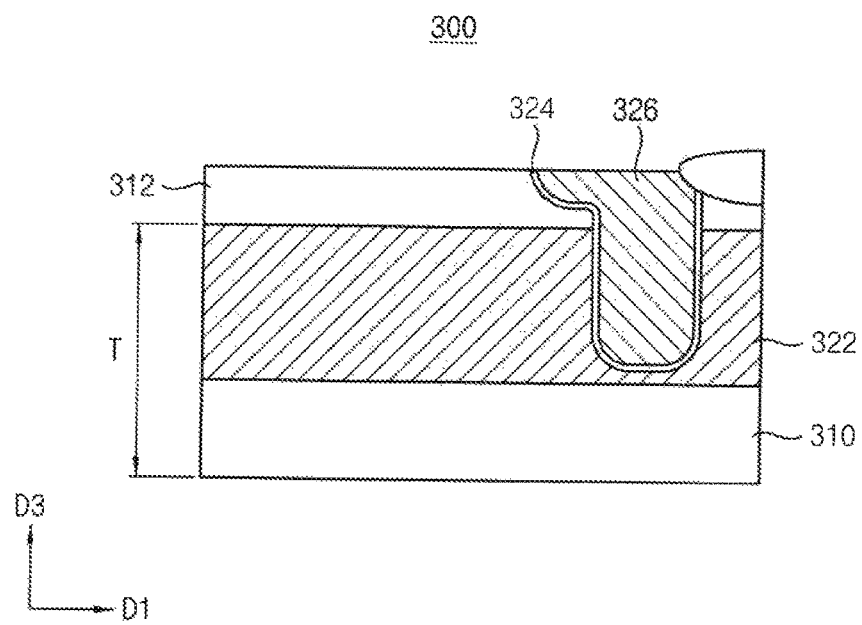
Figure 6:
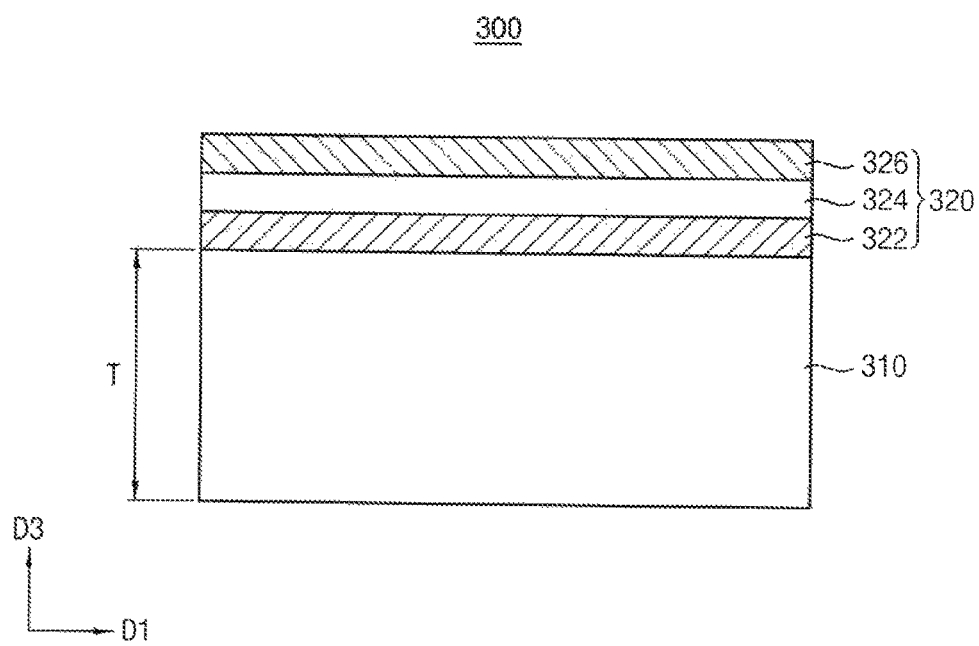

FIG. 1 is a cross-sectional view illustrating a semiconductor package in accordance with example embodiments. FIG. 2 is a plan view illustrating the semiconductor package in FIG. 1. FIG. 3 is a plan view illustrating a capacitor structure of the semiconductor package in FIG. 1. FIGS. 4 to 6 are cross-sectional views illustrating various types of silicon chip capacitors of the capacitor structure in FIG. 3.

Referring to FIGS. 1 to 6, a semiconductor package 100 may include a package substrate 110, a first semiconductor chip 200, a capacitor structure 300 having a decoupling capacitor 320, a plurality of second semiconductor chips 400, a plurality of third semiconductor chips 500, a plurality of fourth semiconductor chips 600, and a molding member 700. The semiconductor package 100 may further include a plurality of conductive connection members 230, 330, 430, 530, 630 configured to electrically connect at least one of the first semiconductor chips 200, the second semiconductor chips 400, the third semiconductor chips 500, the fourth semiconductor chips 600 and the decoupling capacitor 320 to the package substrate 110.

In example embodiments, the package substrate 110 may be a substrate having an upper surface 112 and a lower surface 114 opposite to each other. For example, the package substrate 110 may include a printed circuit board (PCB), a flexible substrate, a tape substrate, etc. The printed circuit board may include a multi circuit board having vias and various circuit elements therein.

A plurality of wirings 160, 162 and substrate pads 120 connected to the wirings 160, 162 may be arranged on the upper surface 112 of the package substrate 110. The wirings 160, 162 may extend on the upper surface 112 of the package substrate 110. The wirings 160, 162 may have a ring shape extending on the upper surface 112 of the package substrate 110. For example, the wirings 160, 162 may form a closed loop on the upper surface 112, electrically connecting the elements to which the wirings 160, 162 are connected. The substrate pads 120 may be connected to respective end portions of the wirings 160, 162. For example, at least a portion of the wirings 160, 162 may be used as the substrate pad 120, thereby forming a landing pad. The wirings 160, 162 may include a power wiring or a ground wiring as a power net for supplying a power to electrical components mounted on the package substrate 110. The substrate pads 120 may include a power pad or a ground pad connected to the power wiring or the ground wiring.

Although not illustrated in the figures, the package substrate 110 may further include substrate signal wirings and substrate signal pads for transferring a data signal to the electric components. Additionally, although some substrate pads are illustrated, the number and locations of the substrate pads are exemplarily illustrated, and thus, it may not be limited thereto. It will be appreciated that the substrate signal pads and the wirings as well as the substrate pads are not illustrated in the figures and explanations concerning the above elements will be omitted for the sake of simplicity.

A first insulation layer 140 may be formed on the upper surface 112 of the package substrate 110 to cover the wirings 160, 162 and expose the substrate pads 120. The first insulation layer 140 may cover the entire upper surface 112 of the package substrate 110 except the substrate pad 120. For example, the first insulation layer 140 may include solder resist.

In example embodiments, the first semiconductor chip 200 may be mounted on the package substrate 110. The first semiconductor chip 200 may be adhered onto the upper surface 112 of the package substrate 110 by an adhesive member 240. The first semiconductor chip 200 may include an integrated circuit. For example, the first semiconductor chip 200 may be a logic chip including a logic circuit. The logic chip may be a controller for controlling memory chips.

The first semiconductor chip 200 may include chip pads 202 on an upper surface, for example, an active surface. The chip pads 202 may include an input/output terminal serving as a power pin or an input/output terminal serving as a ground pin. Although it is not illustrated in the figures, the first semiconductor chip 200 may further include chip signal pads which include input/output terminals serving as data pins. Although some chip pads are illustrated, the number and locations of the chip pads are exemplarily illustrated, and thus, it may not be limited thereto. It will be appreciated that explanations concerning the chip signal pads as well as the chip pads will be omitted for the sake of simplicity. The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The first semiconductor chip 200 may be electrically connected to the package substrate 110 by first conductive connection members 230. In some embodiments, the first conductive connection member 230 may electrically connect each of the chip pads 202 of the first semiconductor chip 200 to a respective one of the substrate pads 120 of the package substrate 110. For example, the first conductive connection member 230 may include a bonding wire. Accordingly, the first semiconductor chip 200 may be stacked on the package substrate 110 by the adhesive member 240, and may be electrically connected to the package substrate 110 by a plurality of the first conductive connection members 230.

Alternatively, the first conductive connection members 230 may include a solder bump, a penetrating electrode (e.g., a through substrate via), a solder ball, a conductive paste, etc. For example, the first semiconductor chip 200 may be mounted on the package substrate 110 in a flip chip bonding manner. In this case, the first semiconductor chip 200 may be arranged on the package substrate 110 such that the active surface of the first semiconductor chip 200 on which the chip pads 202 are formed faces the package substrate 110. The chip pads 202 of the first semiconductor chip 200 may be electrically connected to the substrate pads 120 of the package substrate 110 by the conductive bumps, for example, solder bumps. Additionally, a plurality of the first semiconductor chips 200 may be sequentially stacked on the package substrate 110.

In example embodiments, the capacitor structure 300 may be arranged to be spaced apart from the first semiconductor chip 200 on the package substrate 110. For example, the capacitor structure 300 may be spaced apart from the first semiconductor chip 200 in a first direction D1 and/or a second direction D2. In some embodiments, the capacitor structure 300 may be formed horizontally adjacent to the first semiconductor chip 200. For example, an upper surface of the capacitor structure 300 may be on the same vertical level as an upper surface of the first semiconductor chip 200, and a lower surface of the capacitor structure 300 may be on the same vertical level as a lower surface of the first semiconductor chip 200. The capacitor structure 300 may be adhered onto the upper surface 112 of the package substrate 110 by an adhesive member 340. The capacitor structure may be arranged between the package substrate 110 and other electric components to support the electric components. For example, the capacitor structure 300 may be disposed on the package substrate 110, and other electronic components may be disposed on the capacitor structure 300.

The capacitor structure 300 may include a semiconductor substrate 310 and at least one decoupling capacitor 320 formed in an upper surface of the semiconductor substrate 310. For example, as explained further below, the at least one decoupling capacitor 320 may be formed to an implant depth in an upper region of the semiconductor substrate 310. The implant depth may extend to a particular depth below the top surface of the semiconductor substrate 310, and the at least one decoupling capacitor 320 may be embedded in the substrate to the implant depth. For example, the upper surface of the at least one decoupling capacitor 320 may be at the same vertical level as the top surface of the semiconductor substrate 310, and the lower portion of the at least one decoupling capacitor 320 may be at the implant depth. The semiconductor substrate 310 may be adhered onto the upper surface 112 of the package substrate 110 by the adhesive member 340. For example, the adhesive member 340 may include an adhesive film such as a direct adhesive film (DAF).

A thickness of the capacitor structure 300 may be determined based on a thickness of the semiconductor substrate 310. After the decoupling capacitor 320 is formed on a silicon wafer by a semiconductor manufacturing process, a backside of the wafer may be removed by a planarization process, such that the semiconductor substrate 310 has a desired height measured in the third direction D3. For example, the capacitor structure 300 may have a height or the thickness of from about 10 μm to about 800 μm.

In example embodiments, the thickness of the capacitor structure 300 may be substantially the same as the thickness of the first semiconductor substrate 310. Accordingly, the upper surface of the first semiconductor chip 200 may be coplanar with the upper surface of the capacitor structure 300.

The capacitor structure 300 may include capacitor pads 302 on the upper surface of the capacitor structure 300. For example, the capacitor pads 302 may be formed on the upper surface of the first semiconductor substrate 310. The capacitor pads 302 may include a power terminal pad or a ground terminal pad of the decoupling capacitor 320.

The capacitor structure 300 may be electrically connected to the package substrate 110 by second conductive connection members 330. In some embodiments, the second conductive connection members 330 may electrically connect the capacitor pads 302 of the decoupling capacitor 320 (e.g., the power terminal pad and the ground terminal pad) to the substrate pads 120 of the package substrate 110. For example, the second conductive connection member 330 may include a bonding wire. Accordingly, the capacitor structure 300 may be stacked on the package substrate 110 by the adhesive member 340 and may be electrically connected to the package substrate 110 by a plurality of the second conductive connection members 330.

Alternatively, the second conductive connection members 330 may include a solder bump, a penetrating electrode, a solder ball, a conductive paste, etc. In an embodiment, the capacitor pads 302 may be electrically connected to the substrate pads 120 of the package substrate 110 by the penetrating electrodes penetrating the capacitor structure 300. In another embodiment, the capacitor structure 300 may be arranged on the package substrate 110 such that the surface of the capacitor structure 300 on which the capacitor pads 302 are formed faces the package substrate 110. The capacitor pads 302 of the capacitor structure 300 may be electrically connected to the substrate pads 120 of the package substrate 110 by the conductive bumps, for example, solder bumps.

In example embodiments, a plurality of the second semiconductor chips 400 and a plurality of the third semiconductor chips 500 may be mounted on the package substrate 110. The second semiconductor chips 400 and the third semiconductor chips 500 may be arranged to be spaced apart from the first semiconductor chip 200 and the capacitor structure 300 on the package substrate 110. For example, the second semiconductor chips 400 and the third semiconductor chips 500 may be spaced apart from the first semiconductor chip 200 and the capacitor structure 300 in a first direction D1 and/or a second direction D2. The second semiconductor chips 400 may be adhered onto the upper surface 112 of the package substrate 110 by an adhesive member (not shown). For example, the adhesive member may include an adhesive film such as a direct adhesive film (DAF).

The second semiconductor chip 400 may include chip pads 402 on an upper surface of the second semiconductor chip 400 (e.g., an active surface). The chip pads 402 may include an input/output terminal serving as a power pin or an input/output terminal serving as a ground pin. Although not illustrated in the figures, the second semiconductor chip 400 may further include chip signal pads which include input/output terminals serving as data pins.

The second semiconductor chip 400 may be electrically connected to the package substrate 110 by third conductive connection members 430. In some embodiments, the third conductive connection members 430 may electrically connect the chip pad 402 of the second semiconductor chip 400 to the substrate pad 120 of the package substrate 110. For example, the third conductive connection members 430 may include a bonding wire. Accordingly, the second semiconductor chips 400 may be stacked on the package substrate 110 by the adhesive member and may be electrically connected to the package substrate 110 by a plurality of the third conductive connection members 430. Alternatively, the third conductive connection members 430 may include a solder bump, a penetrating electrode, a solder ball, a conductive paste, etc.

The third semiconductor chip 500 may include chip pads 502 on an upper surface of the third semiconductor chip 500 (e.g., an active surface). The chip pads 502 may include an input/output terminal serving as a power pin or an input/output terminal serving as a ground pin. Although not illustrated in the figures, the third semiconductor chip 500 may further include chip signal pads which include input/output terminals serving as data pins.

The third semiconductor chip 500 may be electrically connected to the package substrate 110 by fourth conductive connection members 530. In some embodiments, the fourth conductive connection members 530 may electrically connect the chip pad 502 of the third semiconductor chip 500 to the substrate pad 120 of the package substrate 110. For example, the fourth conductive connection members 530 may include a bonding wire. Accordingly, the third semiconductor chips 500 may be stacked on the package substrate 110 by the adhesive member (not shown), and may be electrically connected to the package substrate 110 by a plurality of the fourth conductive connection members 530. Alternatively, the fourth conductive connection members 530 may include a solder bump, a penetrating electrode, a solder ball, a conductive paste, etc.

The second and third semiconductor chips 400 and 500 may be memory chips including a memory circuit. For example, the second and third semiconductor chips 400 and 500 may include volatile memory devices such as dynamic random access memory (DRAM) devices. The number, sizes, locations, etc. of the second and third semiconductor chips 400 and 500 are exemplarily illustrated, and thus, it may not be limited thereto.

In example embodiments, a plurality of the fourth semiconductor chips 600 may be stacked on the first semiconductor chip 200, the capacitor structure 300, the second semiconductor chips 400 and the third semiconductor chips 500 in the third direction D3. For example, when viewed in a plan view, the fourth semiconductor chips 600 may overlap the first semiconductor chip 200, the capacitor structure 300, the second semiconductor chips 400 and the third semiconductor chips 500. The fourth semiconductor chips 600 may be mounted on the package substrate 110 and may be supported by the capacitor structure 300. In the example of FIG. 1, the fourth semiconductor chips 600 may include fourth semiconductor chips 600a, 600b, 600c and 600d. The fourth semiconductor chips 600a, 600b, 600c and 600d may be adhered onto the capacitor structure 300 by adhesive members 640a, 640b, 640c and 640d, respectively. For example, the adhesive members 640a, 640b, 640c and 640d may include an adhesive film such as a direct adhesive film (DAF).

The fourth semiconductor chips 600 may include chip pads 602 on an upper surface of the fourth semiconductor chips 600 (e.g., an active surface). In some embodiments, each of the fourth semiconductor chips 600a, 600b, 600c and 600d may include chip pads 602 on a corresponding upper surface of the fourth semiconductor chips 600a, 600b, 600c and 600d. The chip pads 602 may include an input/output terminal serving as a power pin or an input/output terminal serving as a ground pin. Although not illustrated in the figures, the fourth semiconductor chips 600 may further include chip signal pads which include input/output terminals serving as data pins.

The fourth semiconductor chip 600 may be electrically connected to the package substrate 110 by fourth conductive connection members 630. In some embodiments, the fourth conductive connection members 630 may electrically connect the chip pads 602 of the fourth semiconductor chips 600 to the substrate pad 120 of the package substrate 110. For example, the fourth conductive connection members 630 may include a bonding wire. Accordingly, the fourth semiconductor chips 600 may be stacked on the capacitor structure 300 by the adhesive members 640a, 640b, 640c and 640d, and may be electrically connected to the package substrate 110 by a plurality of the fourth conductive connection members 630.

The fourth semiconductor chips 600 may be memory chips including a memory circuit. For example, the fourth semiconductor chips 600 may include non-volatile memory devices such as NAND flash memory devices. The number, sizes, locations, etc. of the fourth semiconductor chips 600 are exemplarily illustrated, and thus, it may not be limited thereto.

As illustrated in FIG. 3, the capacitor structure 300 may be connected to at least one of the first to fourth semiconductor chips 200, 400, 500, and 600 through the wirings 160, 162 to provide a decoupling function for a corresponding electric component. For example, the capacitor structure 300 including the decoupling capacitors 320 may be configured to decouple one or more of the first to fourth semiconductor chips 200, 400, 500, and 600 from other electrical components.

The capacitor pad 302 of the capacitor structure 300 may be electrically connected to the substrate pad 102 by the second conductive connection member 330, and the substrate pad 120 may be electrically connected to at least one of the first to fourth semiconductor chips 200, 400, 500, and 600 by the wirings 160, 162.

In example embodiments, the capacitor structure 300 may include a plurality of first to fourth decoupling capacitors 320a, 320b, 320c and 320d on the semiconductor substrate 310. Each of the first to fourth decoupling capacitors 320a, 320b, 320c and 320d may include a plurality of the capacitor pads 302. For example, each of the first to fourth decoupling capacitors 320a, 320b, 320c and 320d may include the capacitor pads 302 as the power terminal pad and the ground terminal pad. The first to fourth decoupling capacitors 320a, 320b, 320c and 320d may be formed to be electrically isolated from each other.

An area of the capacitor structure 300 (e.g., the number of the capacitor structures 300) and the number of the decoupling capacitors 320 may be determined by a sawing process of the semiconductor manufacturing process. The capacitor structure 300 divided by the sawing process may include one or more decoupling capacitors 320. For example, in the example of FIG. 3, the capacitor structure 300 includes first to fourth decoupling capacitors 320a, 320b, 320c and 320d.

Additionally, some of the decoupling capacitors 320 may be electrically connected to the package substrate 110. As illustrated in FIG. 3, the first and second decoupling capacitors 320a and 320b may be electrically connected to the substrate pads 120 of the package substrate 110, whereas the third and fourth decoupling capacitor 320c and 320d may not be electrically connected to the package substrate 110. A capacitance of the capacitor structure 300 may be determined by the number of the decoupling capacitors 320 connected to the substrate pads 120 of the package substrate 110. That is, the decoupling capacitors 320 to be connected to the power net of the package substrate 110 may be selected based on the capacitance required in the semiconductor package 100.

In example embodiments, the decoupling capacitors 320 may include at least one of a metal-oxide-semiconductor (MOS) type capacitor (illustrated in FIG. 4), a cell type capacitor (illustrated in FIG. 5), and a metal wiring type capacitor (illustrated in FIG. 6), each of which may be formed on the semiconductor substrate 310 by a semiconductor manufacturing process.

As illustrated in FIG. 4, the MOS type capacitor may include an insulation layer and a metal layer stacked on a semiconductor substrate. The insulation layer may include silicon oxide.

For example, after a decoupling capacitor 320 having a MOS structure is formed on a silicon wafer by a front-end-of-line (FEOL) process of a semiconductor manufacturing process, a backside of the silicon wafer may be removed by a planarization process, such that the wafer has a desired thickness T. Then, the silicon wafer may be divided by a sawing process to form an individual capacitor structure 300. Accordingly, the capacitor structure 300 may include a semiconductor substrate 310 and a metal-oxide-semiconductor (MOS) type capacitor 320 formed in an upper surface of the semiconductor substrate 310. The metal-oxide-semiconductor (MOS) type capacitor 320 may be formed to an implant depth of the upper region of the semiconductor substrate 310.

In a manufacturing method of the MOS type decoupling capacitor 320, first, an N-type semiconductor layer 322 and a P-type semiconductor layer 326 may be sequentially formed in the upper surface of the semiconductor substrate 310 by ion implantation processes. Then, an insulation layer 312 may be formed to cover the N-type and P-type semiconductor layers 322 and 326. The insulation layer 312 may include silicon oxide. Then, capacitor pads 302 may be formed on the insulation layer 312 to be electrically connected to the N-type and P-type semiconductor layers 322 and 326, respectively.

Accordingly, the MOS type decoupling capacitor 320 may include the N-type semiconductor layer 322 as a lower electrode, the P-type semiconductor layer 326 as an upper electrode, and a dielectric layer 324 formed between the N-type semiconductor layer 322 and the P-type semiconductor layer 326.

Alternatively, in the manufacturing method of the MOS type decoupling capacitor 320, an insulation layer may be formed on the upper surface of the semiconductor substrate doped with the N-type semiconductor layer to cover the N-type semiconductor layer, and then, a P-type polysilicon layer may be formed on the insulation layer. In this case, the MOS type capacitor may include the N-type semiconductor layer as the lower electrode and the P-type polysilicon layer as the upper electrode.

As illustrated in FIG. 5, the cell type decoupling capacitor 320 may include a structure similar to a cell capacitor of a memory cell on a on a semiconductor substrate.

For example, after a decoupling capacitor 320 having a capacitor structure provided in a memory cell is formed on a silicon wafer by a front-end-of-line (FEOL) process of a semiconductor manufacturing process, a backside of the silicon wafer may be removed by a planarization process, such that the wafer has a desired thickness T. Then, the silicon wafer may be divided by a sawing process to form an individual capacitor structure 300. Accordingly, the capacitor structure 300 may include a semiconductor substrate 310 and a cell type decoupling capacitor 320 formed in an upper surface of the semiconductor substrate 310.

In a manufacturing method of the cell type capacitor, first, a P-type semiconductor layer 322 may be formed in the upper surface of the semiconductor substrate 310 by an ion implantation process and an insulation interlayer 312 may be formed to cover the P-type semiconductor layer 322. For example, ion implantation may be used to penetrate the upper surface of the semiconductor substrate 310, thereby forming the P-type semiconductor layer 322 to an implant depth of an upper region of the semiconductor substrate 310. Then, after an opening is formed in the P-type semiconductor layer 322, a dielectric layer 324 and a storage node 326 may be formed sequentially in the opening. For example, a dielectric layer 324 may be conformally formed on along the opening, and the storage node 326 may be formed to fill the remainder of the opening. Then, after an upper insulation layer (not illustrated) is formed on the insulation interlayer 312 to cover the storage node 326, capacitor pads (not illustrated) may be formed on the upper insulation layer to be electrically connected to the P-type semiconductor layer 322 and the storage node 326 respectively.

Accordingly, the cell type capacitor 320 may include the P-type semiconductor layer 322 as a lower electrode, the storage node 326 as an upper electrode and the dielectric layer 324 formed between the P-type semiconductor layer 322 and the storage node 326.

As illustrated in FIG. 6, the metal wiring type decoupling capacitor 320 may include an upper wiring layer structure on a semiconductor substrate.

For example, after a metal wiring type decoupling capacitor 320 having an upper wiring layer structure is formed on a silicon wafer by a front-end-of-line (FEOL) process of a semiconductor manufacturing process, a backside of the silicon wafer may be removed by a planarization process, such that the wafer has a desired thickness T. Then, the silicon wafer may be divided by a sawing process to form an individual capacitor structure 300. Accordingly, the capacitor structure 300 may include a semiconductor substrate 310 and a metal wiring type decoupling capacitor 320 formed in an upper surface of the semiconductor substrate 310.

In a manufacturing method of the metal wiring type decoupling capacitor 320, first, a first wiring 322, a dielectric layer 324 and a second wiring 326 may be formed sequentially on the upper surface of the semiconductor substrate 310 by an upper wiring process. Then, capacitor pads (not illustrated) may be formed to be electrically connected to the first and second wirings 322 and 326 respectively.

Accordingly, the metal wiring type capacitor 320 may include the first wiring 322 as a lower electrode, the second wiring 326 as an upper electrode and the dielectric layer 324 between the first wiring 322 and the second wiring 326.

In example embodiments, referring to FIG. 1, the molding member 700 may be formed on the package substrate 110 to protect the first semiconductor chip 200, the capacitor structure 300, the second semiconductor chips 400, the third semiconductor chips 500 and the fourth semiconductor chips 600 from the surrounding environment. The molding member may include epoxy molding compound (EMC).

Outer connection pads 130 for supplying an electrical signal may be formed on the lower surface 114 of the package substrate 110. The outer connection pads 130 may be exposed from a second insulation layer 150. For example, the second insulation layer 150 may surround, but not cover, the outer connection pads 130. The second insulation layer 150 may include a silicon oxide layer, a silicon nitride or a silicon oxynitride layer. An outer connection member 800 for electrical connection with an external device (not illustrated) may be disposed on the outer connection pad 130. For example, the outer connection member 800 may include an external connection terminal such as a solder ball. The semiconductor package 100 may be mounted on a module substrate (not illustrated) via the solder balls to form a memory module. For example, outer connection member 800 may provide contact between the semiconductor package 100 and the module substrate.

As mentioned above, the semiconductor package 100 may include the capacitor structure 300 having the decoupling capacitor 320 and the semiconductor chips 600 formed on and the capacitor structure 300. Since the capacitor structure 300 is formed by a semiconductor manufacturing process, the capacitor structure 300 may provide a desired area and thickness in consideration of the size and thickness of the semiconductor chips 600 mounted in the semiconductor package 100. Additionally, the capacitor structure 300 may include a plurality of the decoupling capacitors 320 and thus may provide a desired capacitance required in the semiconductor package 100 within a predetermined dimension.

Hereinafter, a method of manufacturing the semiconductor package in FIG. 1 will be explained.

FIGS. 7 to 11 are views illustrating a method of manufacturing a semiconductor package in accordance with example embodiments.

Figure 7:
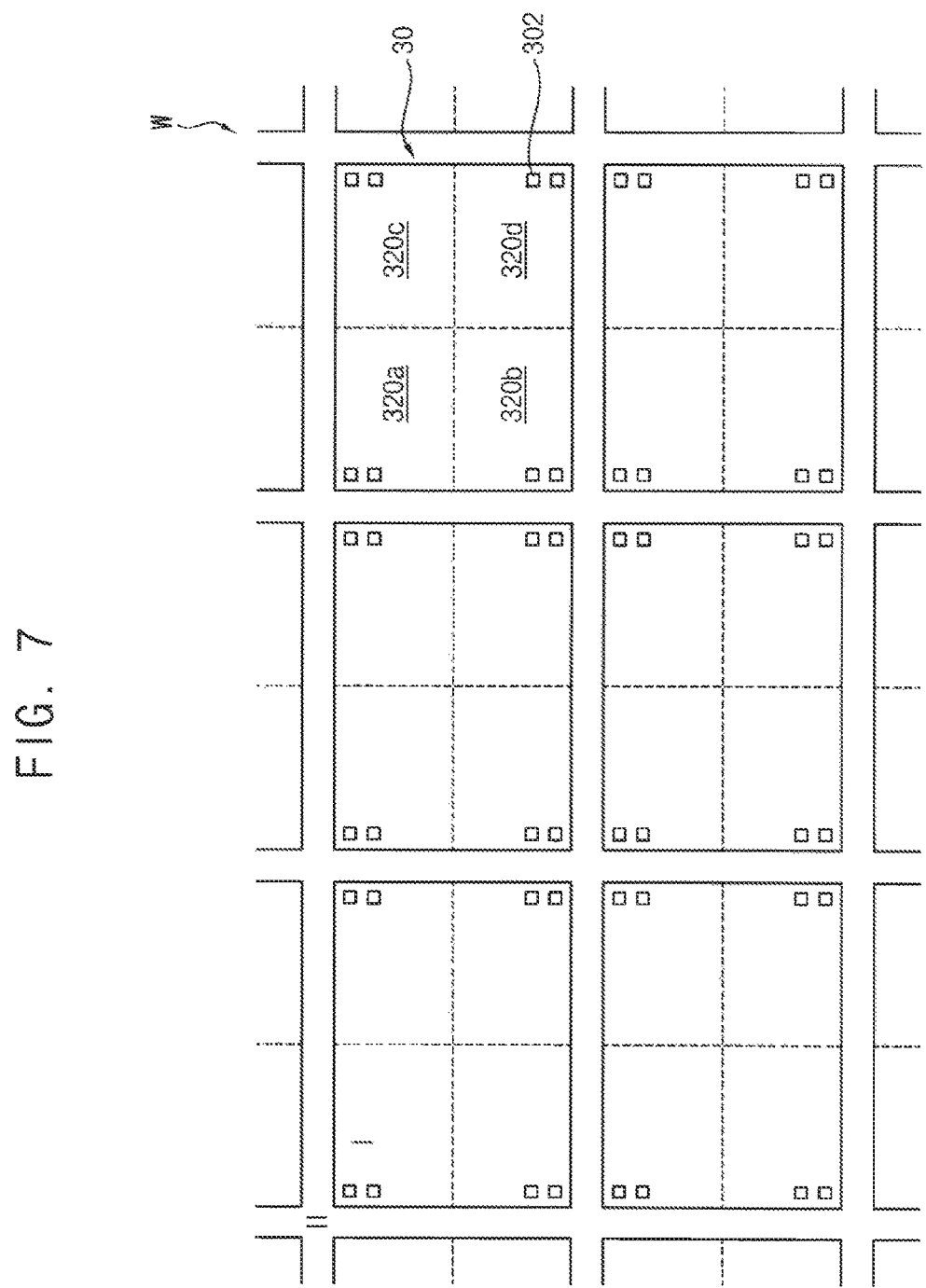

Referring to FIG. 7, first, a semiconductor manufacturing process may be performed on a semiconductor substrate to form a plurality of chip capacitors 30, and then, the semiconductor substrate may be cut by a sawing process into an individual capacitor structure.

In example embodiments, a semiconductor manufacturing process may be performed on a silicon wafer W to form chip capacitors 30, and then, a backside of the silicon wafer W may be removed by a planarization process to achieve a desired thickness. For example, the capacitor structure may have the thickness of from about 10 μm to about 800 μm. Then, the wafer W may be cut by a sawing process into the individual capacitor structure, each having at least one the chip capacitor 30.

For example, the chip capacitor 30 may include at least one of a metal-oxide-semiconductor (MOS) type capacitor, as discussed above in connection with FIG. 4, a cell type capacitor, as discussed above in connection with FIG. 5, and a metal wiring type capacitor, as discussed above in connection with FIG. 6. The aforementioned capacitors 320 may be formed on the semiconductor substrate 310 by a semiconductor manufacturing process.

In a manufacturing method of the MOS type capacitor, as illustrated in FIG. 4, first, an N type semiconductor layer 322 and a P type semiconductor layer 326 may be sequentially formed in the upper surface of the semiconductor substrate 310 by ion implantation processes. Then, an insulation layer 312 may be formed to cover the N type and P type semiconductor layers 322 and 326. The insulation layer 312 may include silicon oxide. Then, capacitor pads 302 may be formed on the insulation layer 312 to be electrically connected to the N type and P type semiconductor layers 322 and 326 respectively.

Accordingly, the MOS type capacitor 320 may include the N type semiconductor layer 322 as a lower electrode, the P type semiconductor layer 326 as an upper electrode and a dielectric layer 324 therebetween.

In a manufacturing method of the cell type capacitor, as illustrated in FIG. 5, first, a P type semiconductor layer 322 may be formed in the upper surface of the semiconductor substrate 310 by an ion implantation process and an insulation interlayer 312 may be formed to cover the P type semiconductor layer 322. Then, after an opening is formed in the P type semiconductor layer 322, a dielectric layer 324 and a storage node 326 may be formed sequentially in the opening. Then, after an upper insulation layer is formed on the insulation interlayer 312 to cover the storage node 326, capacitor pads (not illustrated) may be formed on the upper insulation layer to be electrically connected to the P type semiconductor layer 322 and the storage node 326 respectively.

Accordingly, the cell type capacitor 320 may include the P type semiconductor layer 322 as a lower electrode, the storage node 326 as an upper electrode and the dielectric layer 324 therebetween.

In a manufacturing method of the metal wiring type capacitor, as illustrated in FIG. 6, first, a first wiring 322, a dielectric layer 324 and a second wiring 326 may be formed sequentially on the upper surface of the semiconductor substrate 310 by an upper wiring process. Then, capacitor pads (not illustrated) may be formed to be electrically connected to the first and second wirings 322 and 326 respectively.

Accordingly, the metal wiring type capacitor 320 may include the first wiring 322 as a lower electrode, the second wiring 326 as an upper electrode and the dielectric layer 324 therebetween.

In example embodiments, the chip capacitor 30 may include one or more capacitors 320a, 320b, 320c and 320d. The capacitors 320a, 320b, 320c and 320d may have same capacitances. The wafer W may be cut by a sawing process such that, after being divided by the sawing process, one capacitor structure include one or more chip capacitors 30.

For example, when the wafer W is cut such that an individually divided first capacitor structure includes one chip capacitor 30, the first capacitor structure may include four capacitors 320 and may have a first area. The first area may correspond to the number of capacitors included in the first capacitor structure (i.e., four capacitors). When the wafer W is cut such that an individually divided one second capacitor structure includes two chip capacitors 30, the one capacitor structure may include eight capacitors and may have a second area. The second area may correspond to the number of capacitors included in the second capacitor structure (i.e., eight capacitors). In this example, the second area may be two times greater than the first area.

Accordingly, the thickness and the area of the individually divided capacitor structure may be determined by the planarization and the sawing process.

Figure 8:
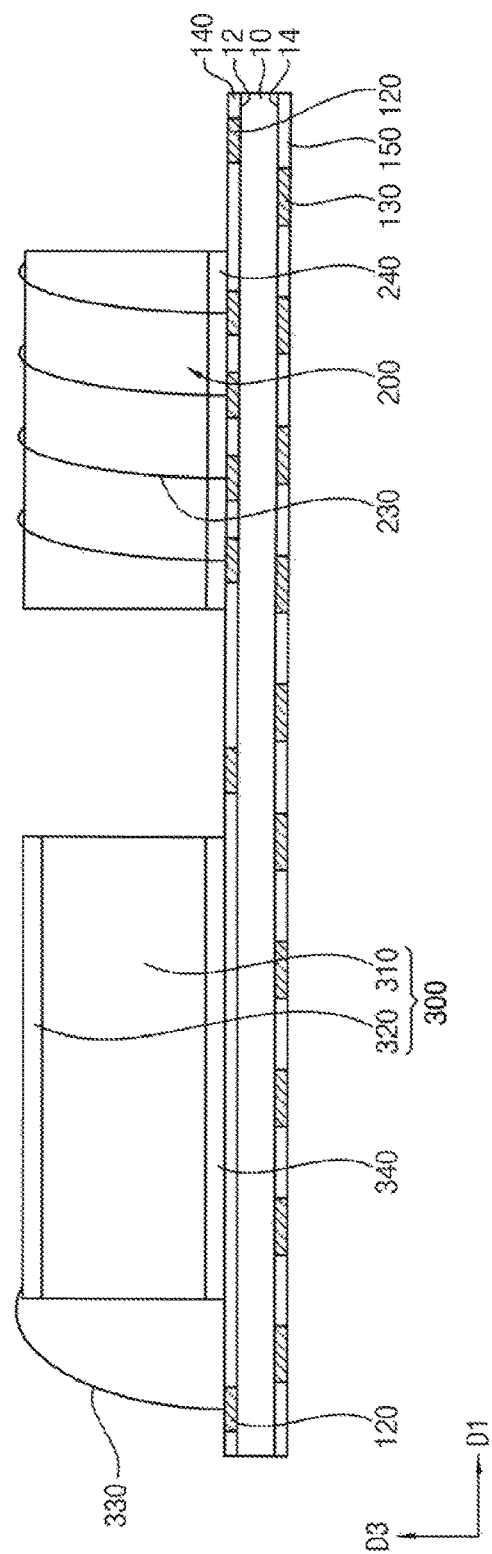

Referring to FIG. 8, a first semiconductor chip 200 and the capacitor structure 300 may be stacked on a semiconductor substrate 10.

The first semiconductor chip 200 may be adhered onto an upper surface 12 of the semiconductor substrate 10 by an adhesive member 240. The capacitor structure 300 may be adhered onto the upper surface 12 of the semiconductor substrate 10 by an adhesive member 340 and may be spaced apart from the first semiconductor chip 200. For example, the adhesive members 240 and 340 may include an adhesive film such as a direct adhesive film (DAF).

Then, a wiring bonding process may be performed to connect chips pads 202 of the first semiconductor chip 200 and capacitor pads 302 of the capacitor structure 300 to substrate pads 120 on the upper surface 12 of the semiconductor substrate 10. The chip pads 202 of the first semiconductor chip 200 may be connected to the substrate pads 120 by first conductive connection members 230. The capacitor pads 302 of the capacitor structure 300 may be connected to the substrate pads 120 by second conductive connection members 330.

Figure 9:
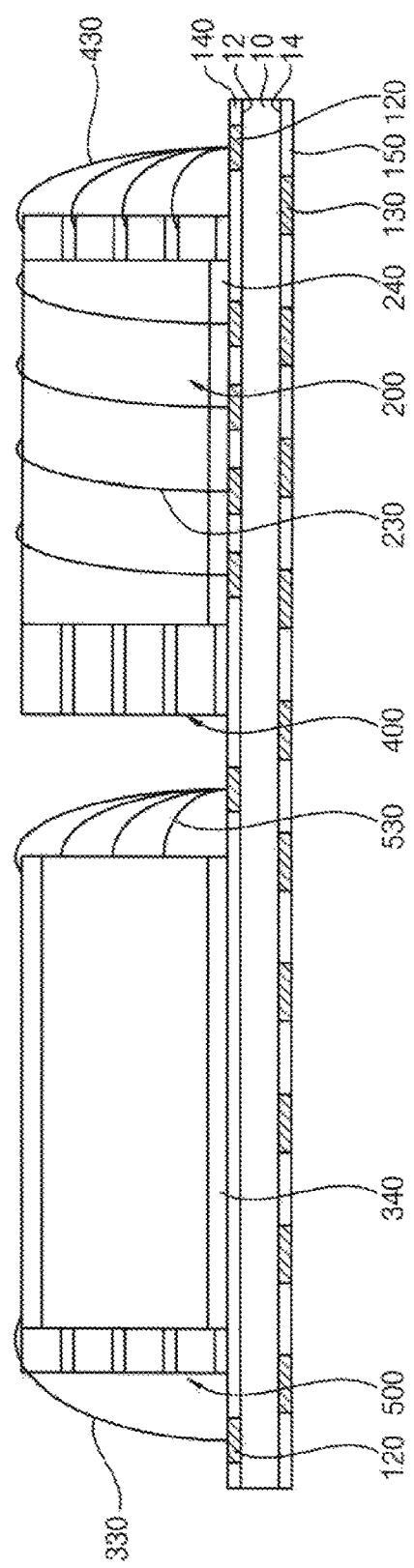

Referring to FIG. 9, a plurality of second semiconductor chips 400 and a plurality of third semiconductor chips 500 may be stacked on the semiconductor substrate 10 and may be spaced apart from the first semiconductor chip 200 and the capacitor structure 300.

A plurality of the second semiconductor chips 400 and a plurality of the third semiconductor chips 500 may be adhered onto the upper surface 12 of the semiconductor substrate 10 by adhesive members.

Then, a wiring bonding process may be performed to connect chips pads 402 of the second semiconductor chip 400 and chip pads 502 of the fourth semiconductor chip 500 to the substrate pads 120 on the upper surface 12 of the semiconductor substrate 10. The chip pads 402 of the second semiconductor chips 400 may be connected to the substrate pads 120 by third conductive connection members 430. The chip pads 502 of the third semiconductor chips 500 may be connected to the substrate pads 120 by fourth conductive connection members 530.

Figure 10:
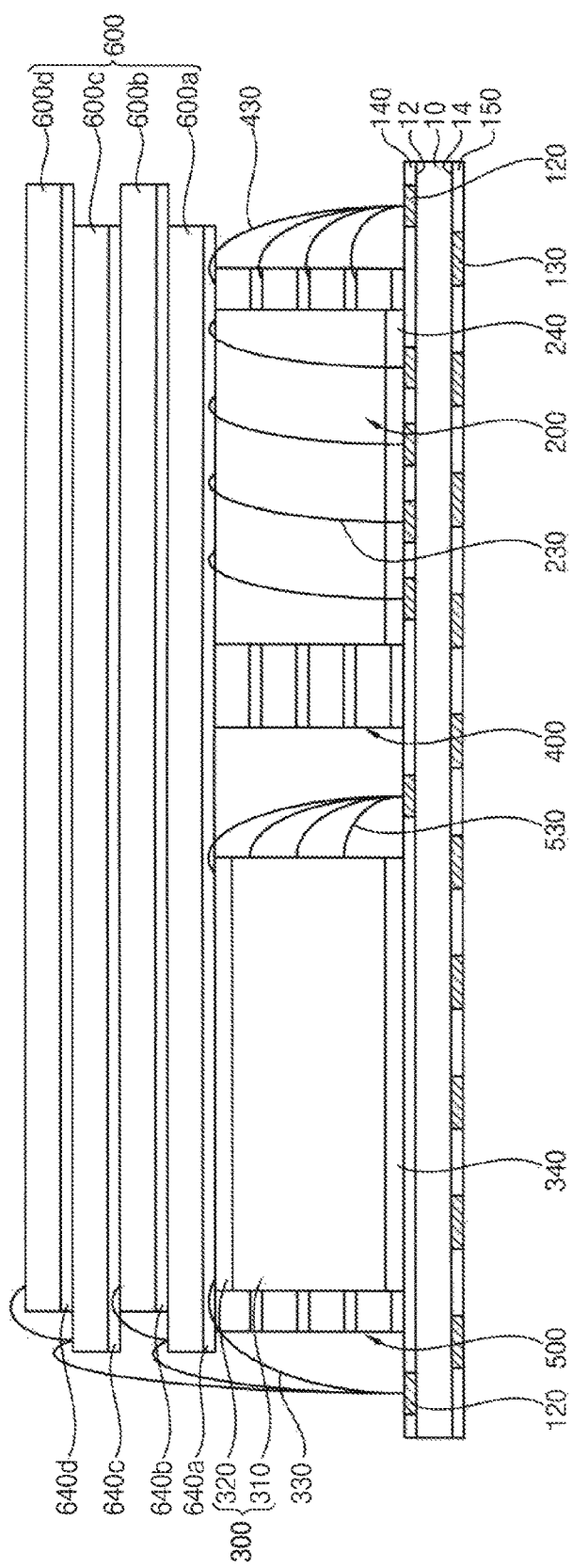

Referring to FIG. 10, a plurality of fourth semiconductor chips 600 may be stacked on the first semiconductor chip 200, the capacitor structure 300, the second semiconductor chips 400 and the third semiconductor chips 500.

The fourth semiconductor chips 600a, 600b, 600c and 600d may be adhered onto the capacitor structure 300 by adhesive members 640a, 640b, 640c and 640d. Accordingly, the fourth semiconductor chips 600a, 600b, 600c and 600d may be mounted on and supported by the semiconductor substrate 10 by the capacitor structure 300. The fourth semiconductor chips 600a, 600b, 600c and 600d may be offset sequentially or in a zigzag manner to each other. An area of the stacked fourth semiconductor chips 600 may be greater than an area of the first semiconductor chip 200 or the capacitor structure 300. For example, when viewed from the top down, the area (e.g., length×width) of individual ones of the fourth semiconductor chips 600 may be greater than the combined area of the first semiconductor chip 200 and the capacitor structure 300.

Then, a wiring bonding process may be performed to connect chips pads of the fourth semiconductor chips 600a, 600b, 600c and 600d to the substrate pads 120 on the upper surface 12 of the semiconductor substrate 10. The chip pads 602 of the fourth semiconductor chips 600a, 600b, 600c and 600d may be connected to the substrate pads 120 by fifth conductive connection members 630.

Figure 11:
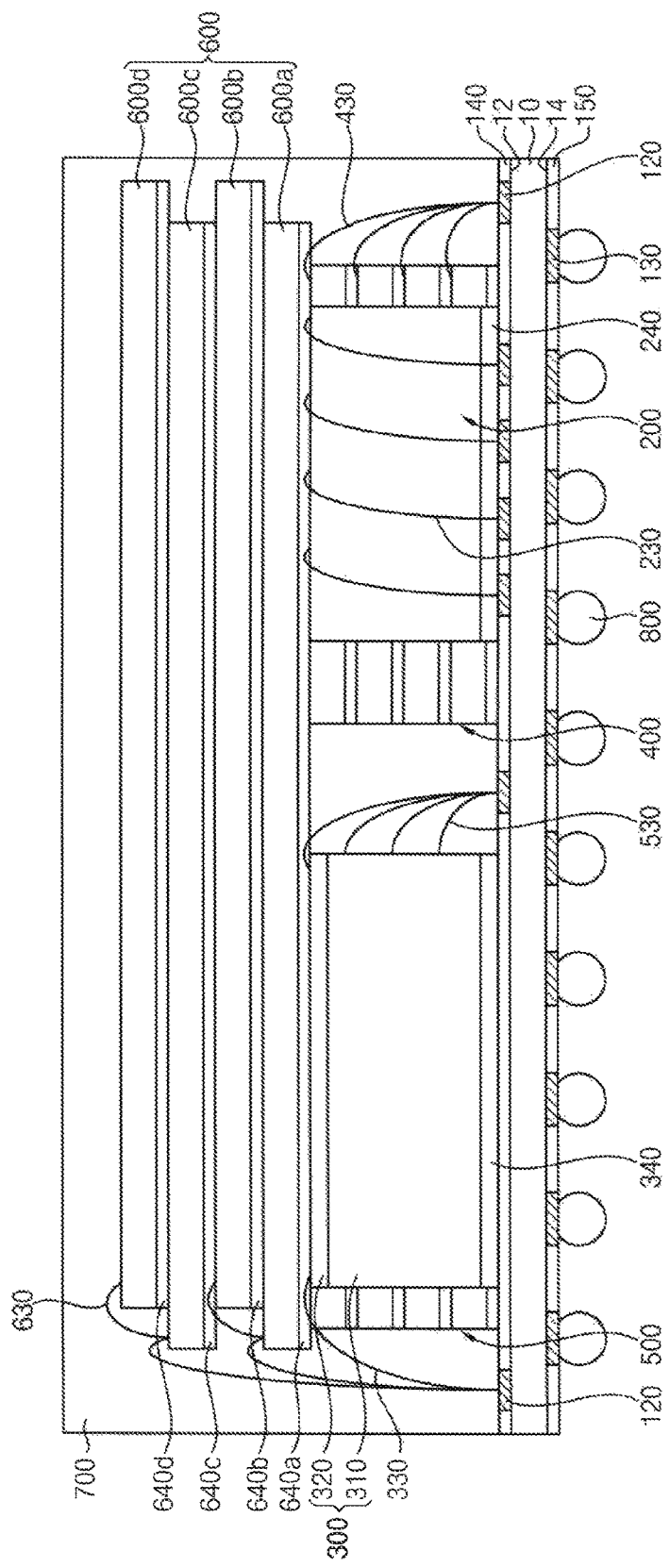

Referring to FIG. 11, a molding member 700 may be formed on the semiconductor substrate 10 to cover the first semiconductor chip 200, the capacitor structure 300, the second semiconductor chips 400, the third semiconductor chips 500 and the fourth semiconductor chips 600. For example, the molding member 700 may be formed on the substrate 110 by a molding process, to cover the first semiconductor chip 200, the capacitor structure 300, the second semiconductor chips 400, the third semiconductor chips 500 and the fourth semiconductor chips 600. The molding member 700 may include epoxy molding compound (EMC). Then, after outer connection members 800 are disposed on outer connection pads 130 on a lower surface 14 of the semiconductor substrate 10, the substrate 10 may be cut by a sawing process into individual semiconductor packages.

Figure 12:
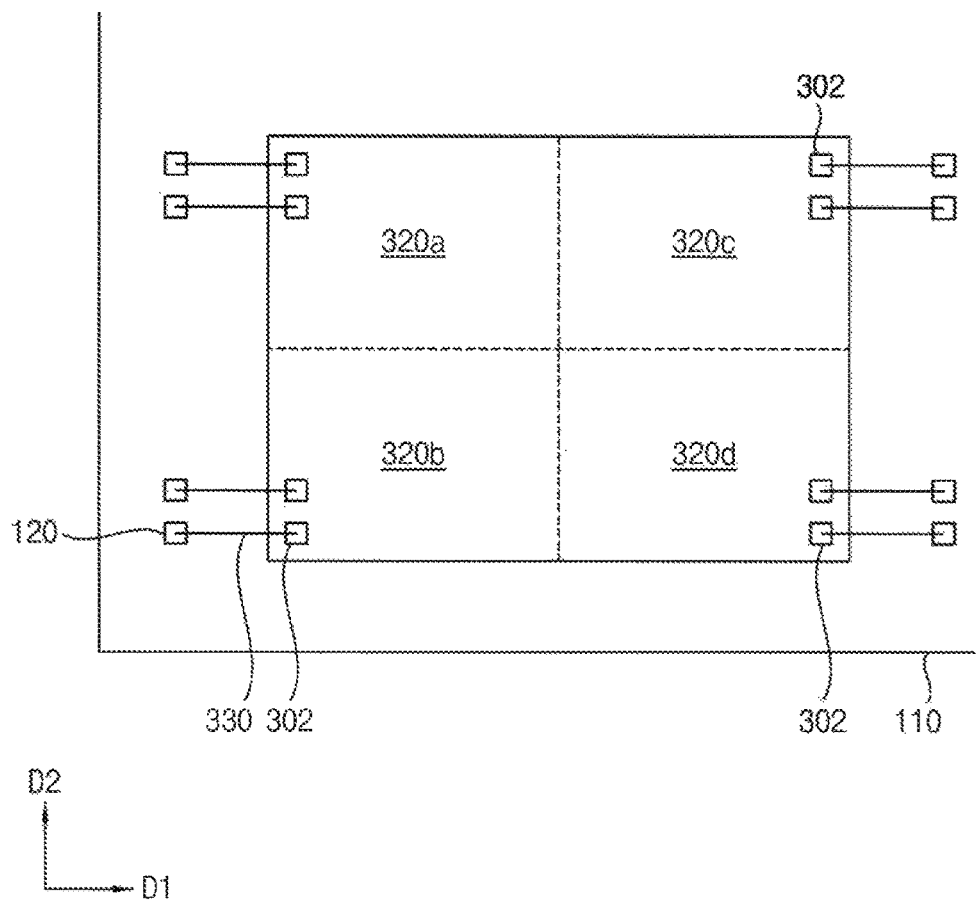
Figure 13:
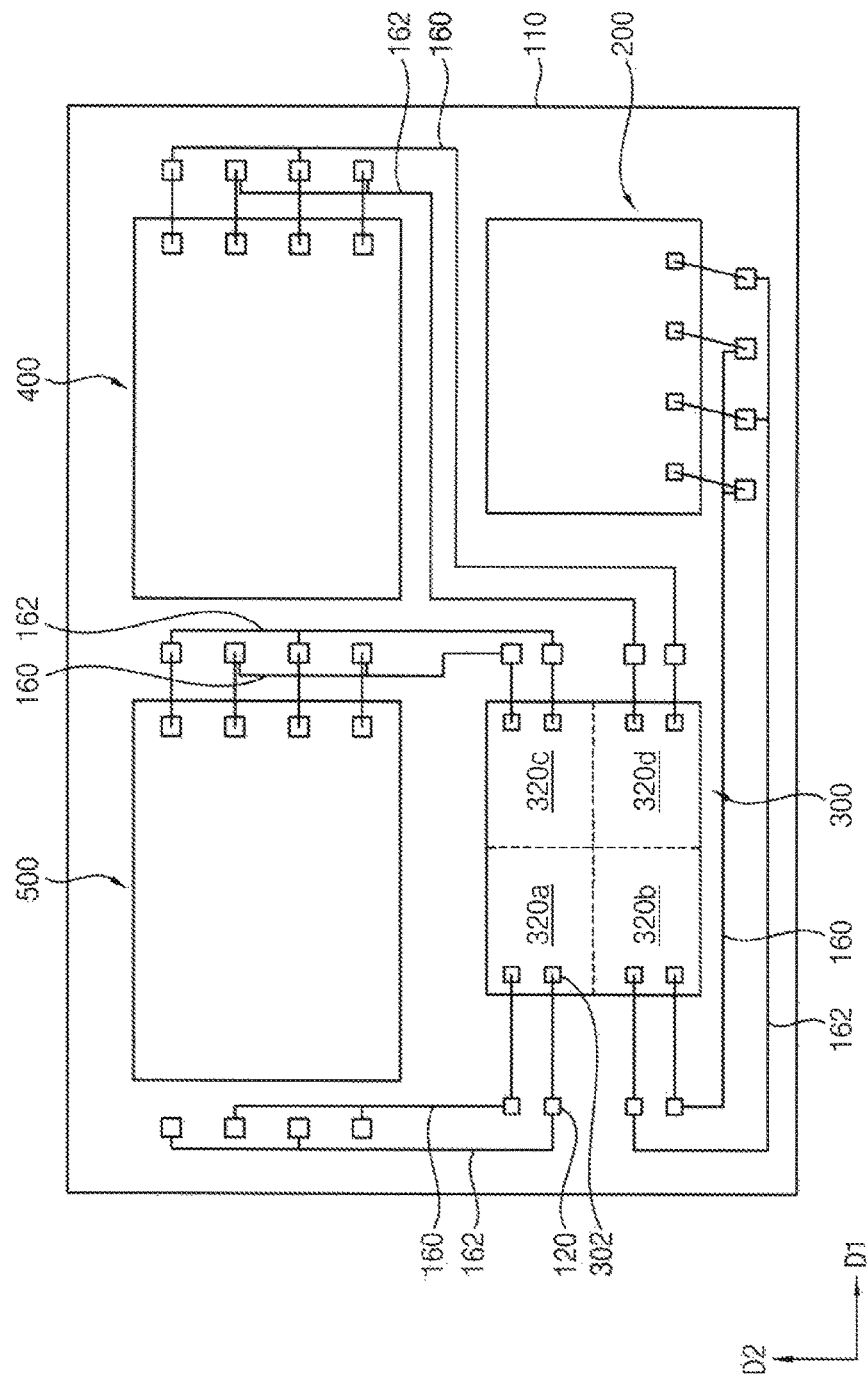

FIG. 12 is a plan view illustrating a capacitor structure of a semiconductor package in accordance with example embodiments. FIG. 13 is a plan view illustrating a package substrate of the semiconductor package in FIG. 12. The semiconductor package may be substantially the same as or similar to the semiconductor package described with reference to FIGS. 1 to 6 except for a connection relation between decoupling capacitors of the capacitor structure. Thus, same reference numerals will be used to refer to the same or like elements and any further repetitive explanation concerning the above elements will be omitted.

Referring to FIGS. 12 and 13, a capacitor structure 300 may include first to fourth decoupling capacitors 320a, 320b, 320c and 320d. Capacitor pads 302 of the first to fourth decoupling capacitors 320a, 320b, 320c and 320d may be electrically connected to substrate pads 120 of a package substrate 110 by bonding wires.

In some embodiments, the capacitor pads 302 of the first decoupling capacitor 320a may be electrically connected to a fourth semiconductor chip 600 through the substrate pads 120 of the package substrate 110 and wirings 160, 162. Accordingly, the first decoupling capacitor 320a may provide a decoupling function for the fourth semiconductor chip 600.

The capacitor pads 302 of the second decoupling capacitor 320b may be electrically connected to a first semiconductor chip 200 through the substrate pads 120 of the package substrate 110 and the wirings 160, 162. Accordingly, the second decoupling capacitor 320b may provide a decoupling function for the first semiconductor chip 200.

The capacitor pads 302 of the third decoupling capacitor 320c may be electrically connected to a third semiconductor chip 400 through the substrate pads 120 of the package substrate 110 and the wirings 160, 162. Accordingly, the third decoupling capacitor 320c may provide a decoupling function for the third semiconductor chip 400.

The capacitor structure 300 may include a plurality of the decoupling capacitors 320 and thus may provide a desired capacitance required for each of the semiconductor chips within a predetermined dimension. For example, the capacitor structure 300, which includes the plurality of the decoupling capacitors 320 each having a predetermined dimension (e.g., length and width), may provide a desired capacitance for each of the semiconductor chips 200, 400, 500, and 600.

Figure 14:
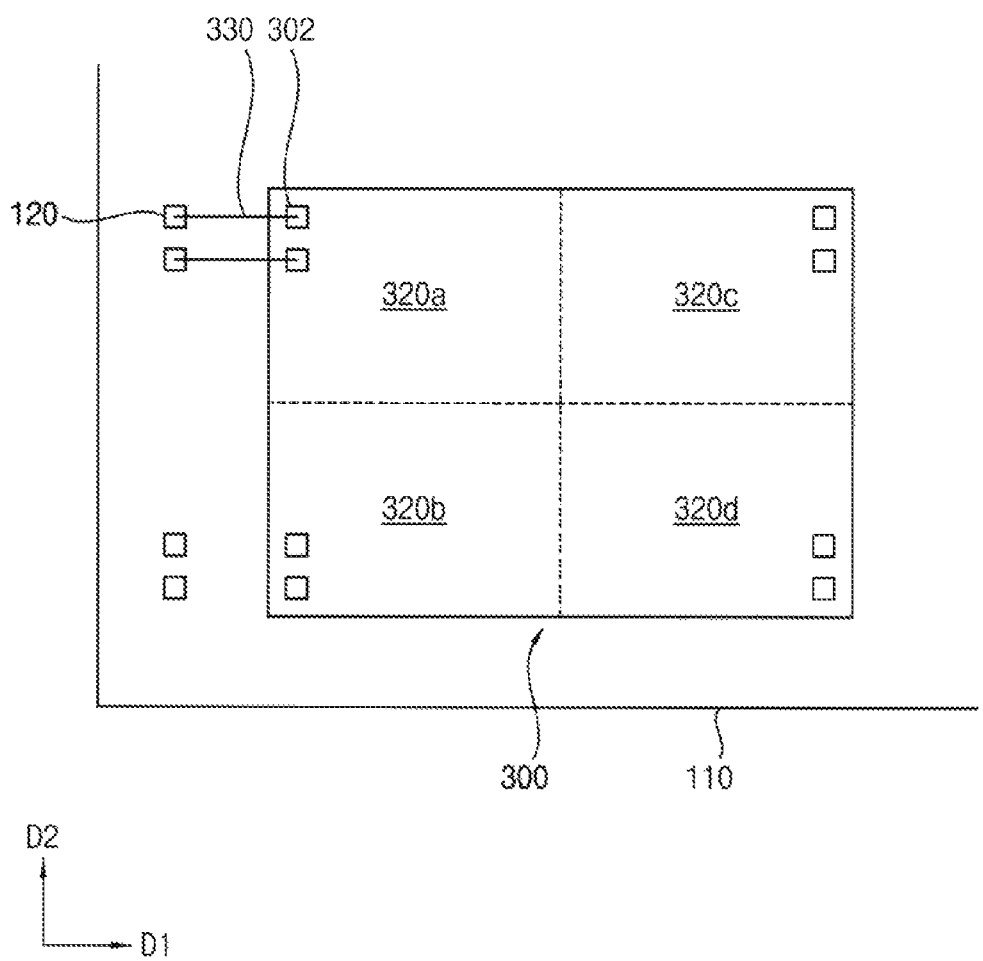
Figure 15:
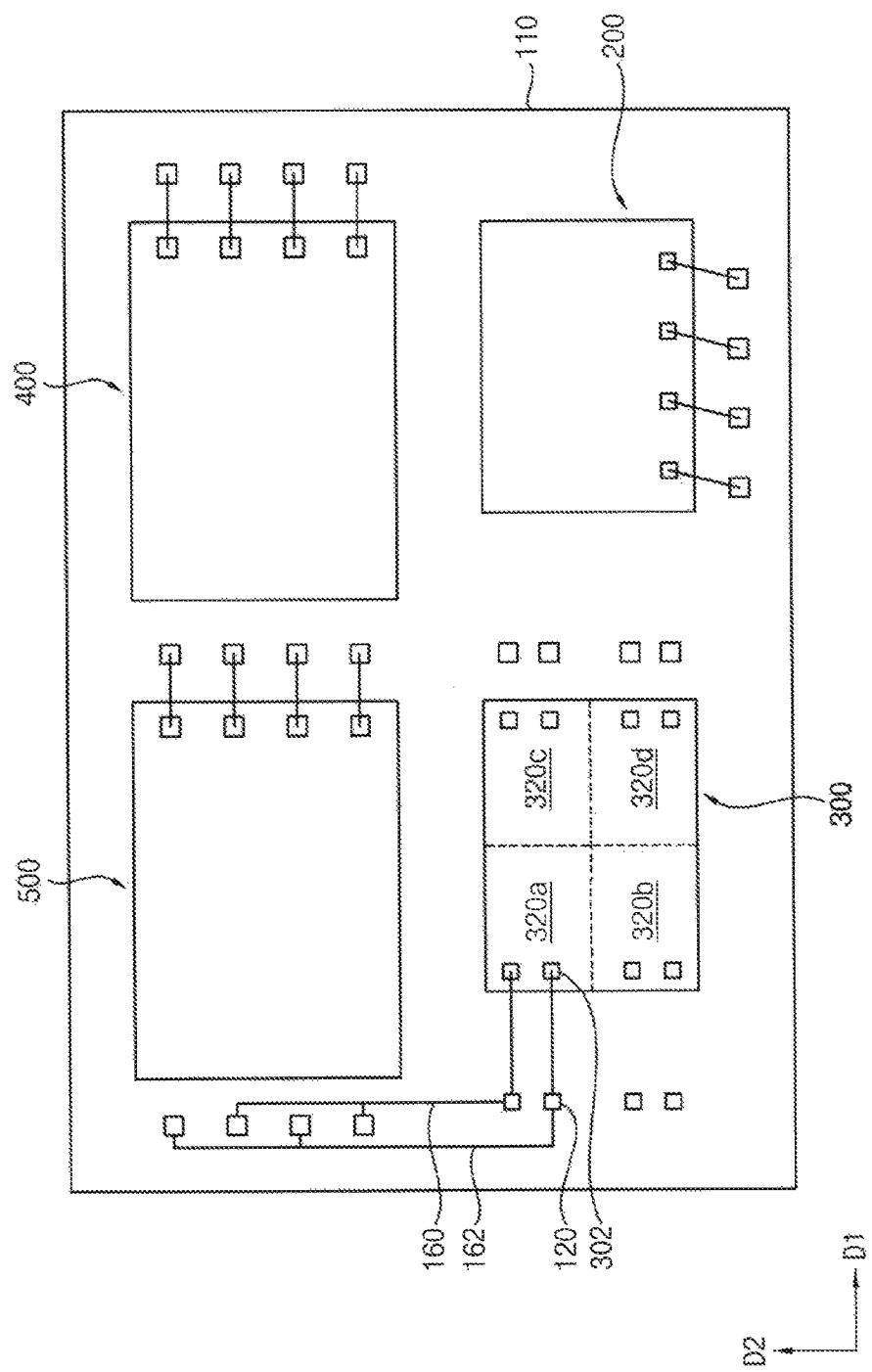

FIG. 14 is a plan view illustrating a capacitor structure of a semiconductor package in accordance with example embodiments. FIG. 15 is a plan view illustrating a package substrate of the semiconductor package in FIG. 14. The semiconductor package may be substantially the same as or similar to the semiconductor package described with reference to FIGS. 1 to 6 except for a connection relation between decoupling capacitors of the capacitor structure. Thus, same reference numerals will be used to refer to the same or like elements and any further repetitive explanation concerning the above elements will be omitted.

Referring to FIGS. 14 and 15, a capacitor structure 300 may include first to fourth decoupling capacitors 320a, 320b, 320c and 320d. Capacitor pads 302 of the first decoupling capacitor of the first to fourth decoupling capacitors 320a, 320b, 320c and 320d may be electrically connected to substrate pads 120 of a package substrate 110 by bonding wires.

In some embodiments, the capacitor pads 302 of the first decoupling capacitor 320a may be electrically connected to a fourth semiconductor chip 600 through the substrate pads 120 of the package substrate 110 and wirings 160, 162. Accordingly, the first decoupling capacitor 320a may provide a decoupling function for the fourth semiconductor chip 600.

Capacitor pads 302 of the remaining second to fourth decoupling capacitor 320b, 320c and 320d may not be electrically connected to the substrate pads 120 of the package substrate.

Accordingly, the capacitor structure 300 may provide a relatively wide supporting area for semiconductor chips thereon and may provide a decoupling function for only a selected semiconductor chip of the semiconductor chips. For example, although only one of the decoupling capacitors (e.g., the first decoupling capacitor 320a) may provide the decoupling function, the first to fourth decoupling capacitor 320a, 320b, 320c and 320d may provide structure that physically supports one or more semiconductor chips formed thereon.

Figure 16:
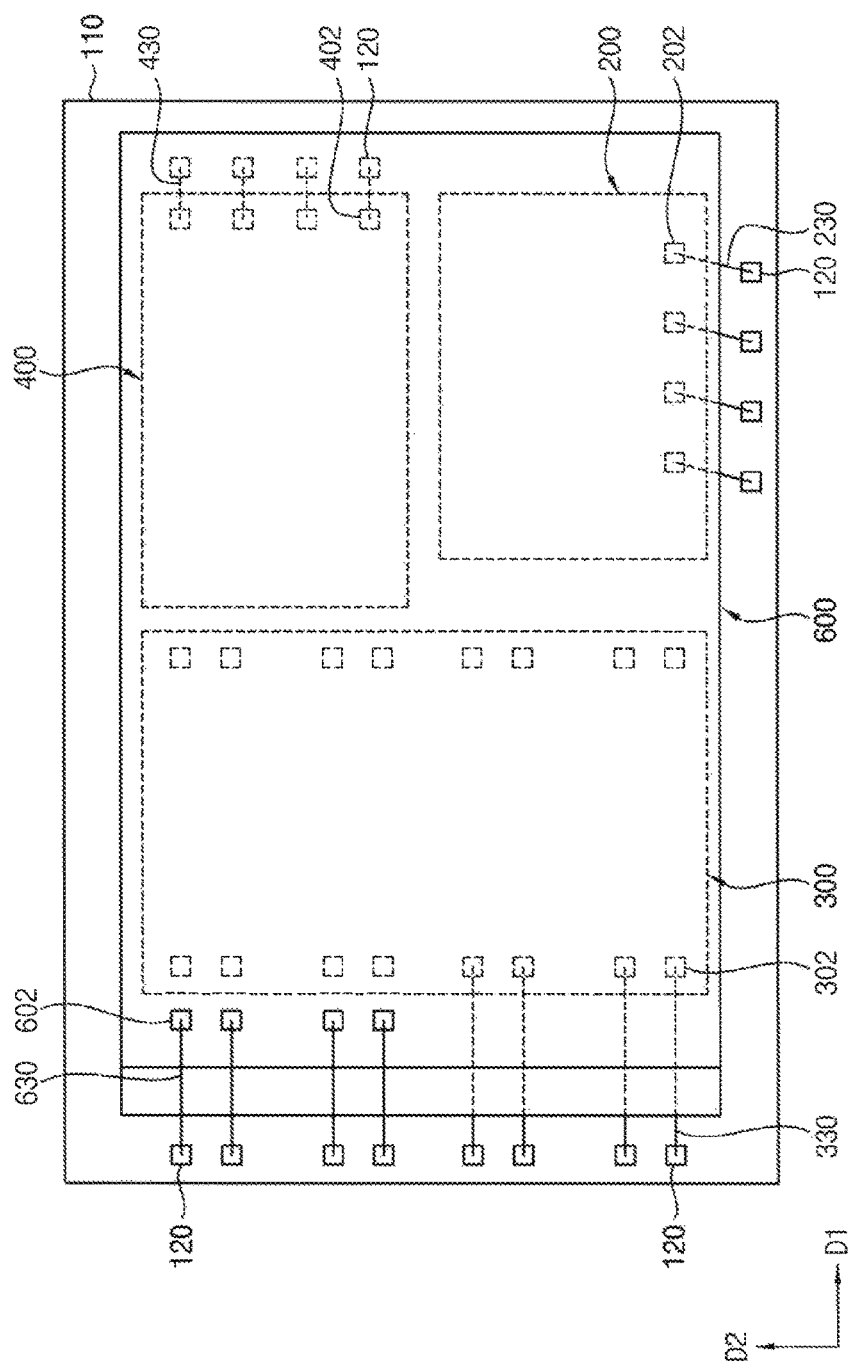

FIG. 16 is a plan view illustrating a semiconductor package in accordance with example embodiments. The semiconductor package may be substantially the same as or similar to the semiconductor package described with reference to FIGS. 1 to 6 except for a capacitor structure. Thus, same reference numerals will be used to refer to the same or like elements and any further repetitive explanation concerning the above elements will be omitted.

Referring to FIG. 16, a capacitor structure 300 may have an area about two times greater than an area of the capacitor structure in FIG. 1. The capacitor structure 300 may include eight decoupling capacitors. In some embodiments, the capacitor structure 300 may be formed by a wafer sawing process to include two chip capacitors. For example, in an embodiment where the capacitor structure 300 includes two chip capacitors, the first chip capacitor may include first to fourth decoupling capacitors, and the second chip capacitor may include fifth to eight decoupling capacitors. The area of the capacitor structure 300 may be determined by the sawing process. The capacitor structure 300 having twice the area may be used to support a relatively wider semiconductor chip.

Accordingly, the area of the capacitor structure may be adjusted to support a greater supporting area.

Figure 17:
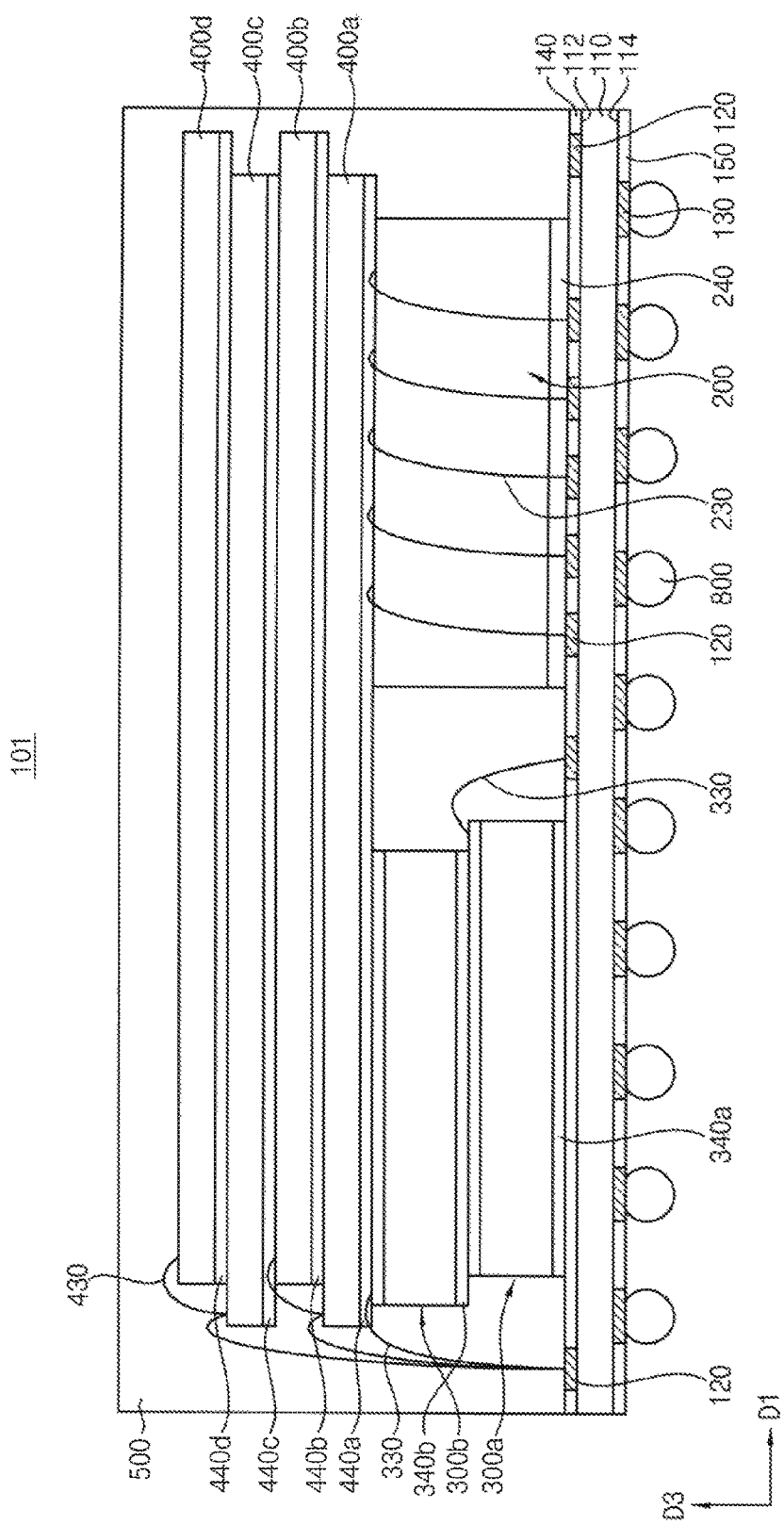
Figure 18:
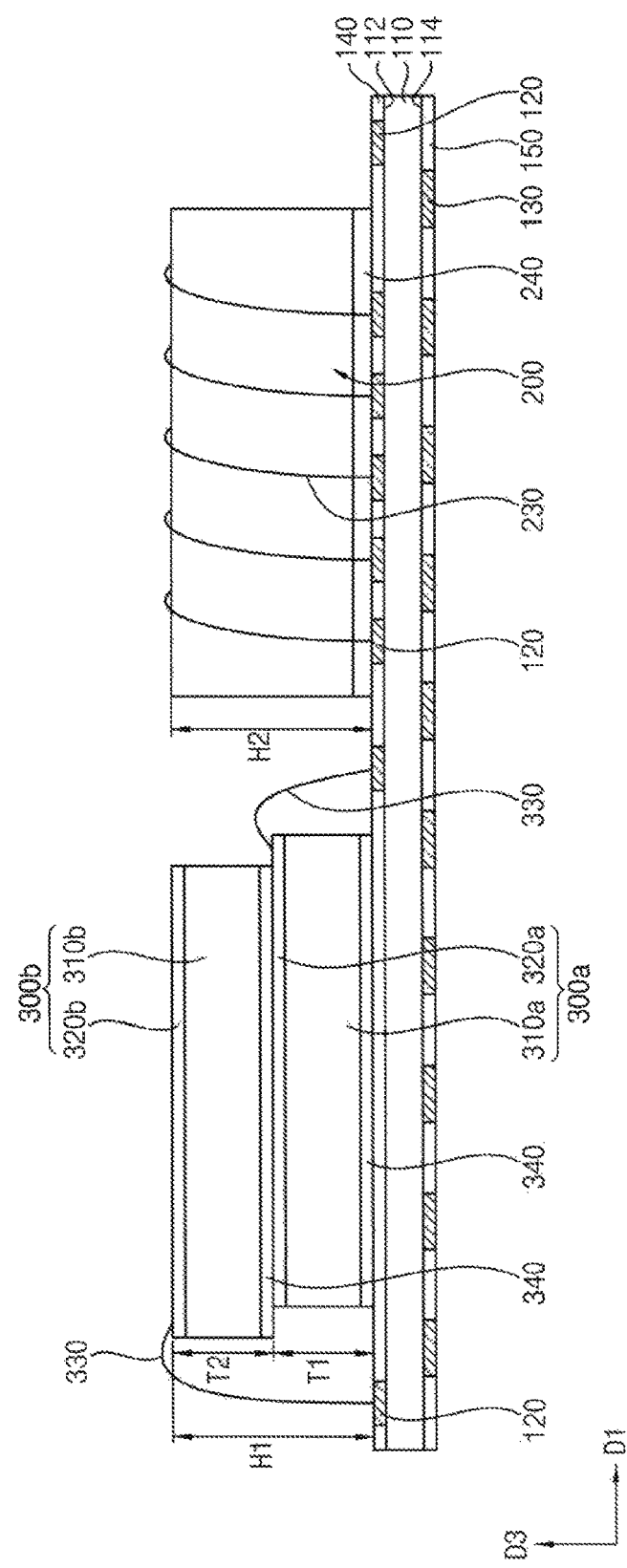
Figure 19:
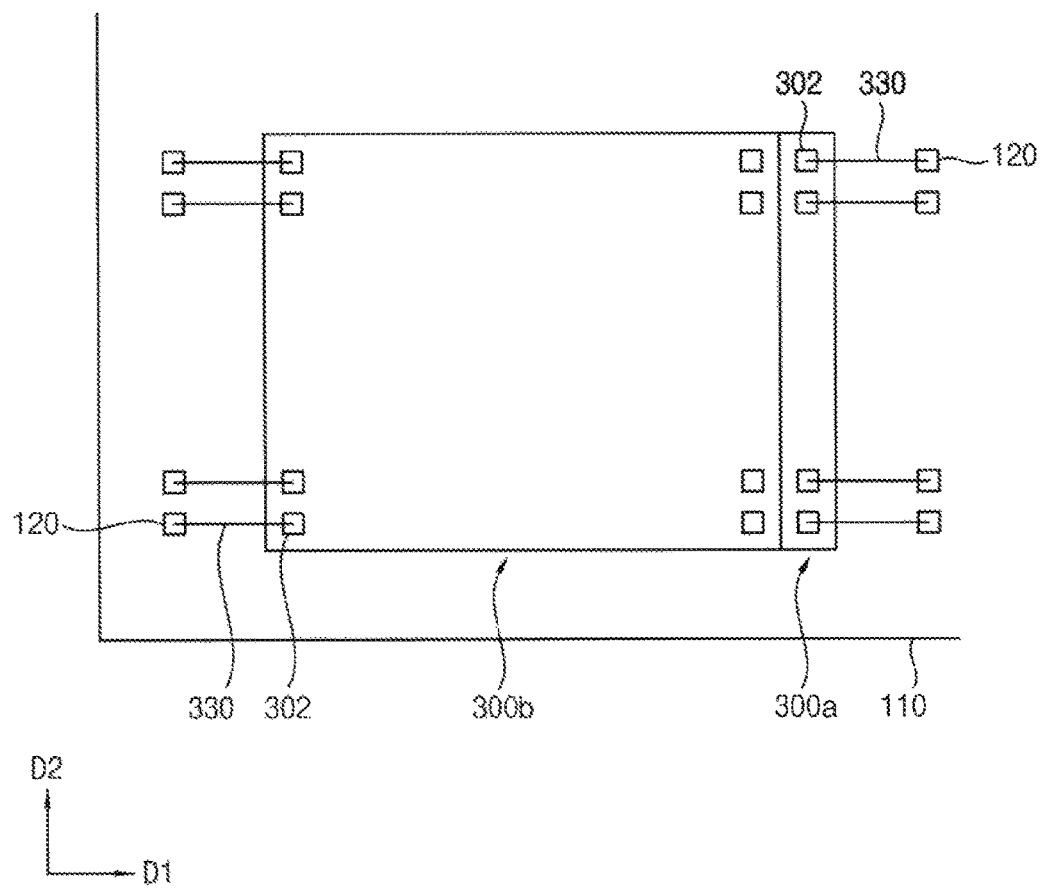

FIG. 17 is a cross-sectional view illustrating a semiconductor package in accordance with example embodiments. FIG. 18 is a cross-sectional view illustrating a capacitor structure and a first semiconductor chip on a package substrate of the semiconductor package in FIG. 17. FIG. 19 is a plan view illustrating the capacitor structure in FIG. 18. The semiconductor package may be substantially the same as or similar to the semiconductor package as described with reference to FIGS. 1 to 6, except for a plurality of capacitor structures. Thus, same reference numerals will be used to refer to the same or like elements and any further repetitive explanation concerning the above elements will be omitted.

Referring to FIGS. 17 to 19, a semiconductor package 101 may include a package substrate 110, a first semiconductor chip 200, first and second capacitor structures 300a and 300b, a plurality of second semiconductor chips 400, and a molding member 500.

In example embodiments, the first semiconductor chip 200 may be mounted on the package substrate 110. The first semiconductor chip 200 may be adhered onto an upper surface 112 of the package substrate 110 by an adhesive member 240. The first semiconductor chip 200 may be electrically connected to the package substrate 110 by first conductive connection members 230. The first conductive connection member 230 may electrically connect a chip pad of the first semiconductor chip 200 to the substrate pad 120 of the package substrate 110.

The first and second capacitor structures 300a and 300b may be stacked sequentially on the upper surface of the package substrate 110. The first capacitor structure 300a may be adhered onto the upper surface 112 of the package substrate 110 by an adhesive member 340a, and the second capacitor structure 300b may be adhered on the first capacitor structure 300a by an adhesive member 340b. Adhesive members 340a and 340b may be a same material.

The first capacitor structure 300a may include a first semiconductor substrate 310a and a first capacitor 320a formed in an upper surface of the first semiconductor substrate 310a. The second capacitor structure 300b may include a second semiconductor substrate 310b and a second capacitor 320b formed in an upper surface of the second semiconductor substrate 310b. For example, the first and second capacitor structures 300a and 300b may be individual same structures cut by a wafer sawing process.

A thickness T1 of the first capacitor structure 300a may be the same as or different from a thickness T2 of the second capacitor structure 300b. For example, a height of the first capacitor structure 300a in the third direction D3 may be the same or different from the height of the second capacitor structure 300b in the third direction D3. Accordingly, a plurality of capacitor structures 300a and 300b may be stacked on each other to be used as a support member having a desired height (e.g., including a combined height of the first and second capacitor structures 300a and 300b and adhesive members 340a and 340b).

The first capacitor structure 300a may be electrically connected to the package substrate 110 by second conductive connection members 330. Capacitor pads 302 of the first capacitor 320a of the first capacitor structure 300a may be electrically connected to the substrate pads of the package substrate 110 by the second conductive connection members 330. The second capacitor structure 300b may be electrically connected to the package substrate 110 by the second conductive connection members 330. Capacitor pads 302 of the second capacitor 320b of the second capacitor structure 300b may be electrically connected to the substrate pads of the package substrate 110 by the second conductive connection members 330.

A plurality of the second semiconductor chips 400 (e.g., semiconductor chips 400a, 400b, 400c and 400d) may be stacked on the first semiconductor chip 200 and the first and second capacitor structures 300a and 300b. The second semiconductor chips 400 may be mounted on and supported by the package substrate 110 by the first and second capacitor structures 300a and 300b. The second semiconductor chips 400a, 400b, 400c and 400d may be adhered on the capacitor structure 300 by adhesive members 440a, 440b, 440c and 440d, respectively.

The second semiconductor chips 400 may be electrically connected to the package substrate 110 by third conductive connection members 430. The third conductive connection member 430 may electrically connect a chip pad of the second semiconductor chip 400 to the substrate pad 120 of the package substrate 110. The molding member 500 may be formed on the package substrate 110 to protect the first semiconductor chip 200, the first and second capacitor structures 300a and 300b and the second semiconductor chips 400 from the surrounding environment.

Figure 20:
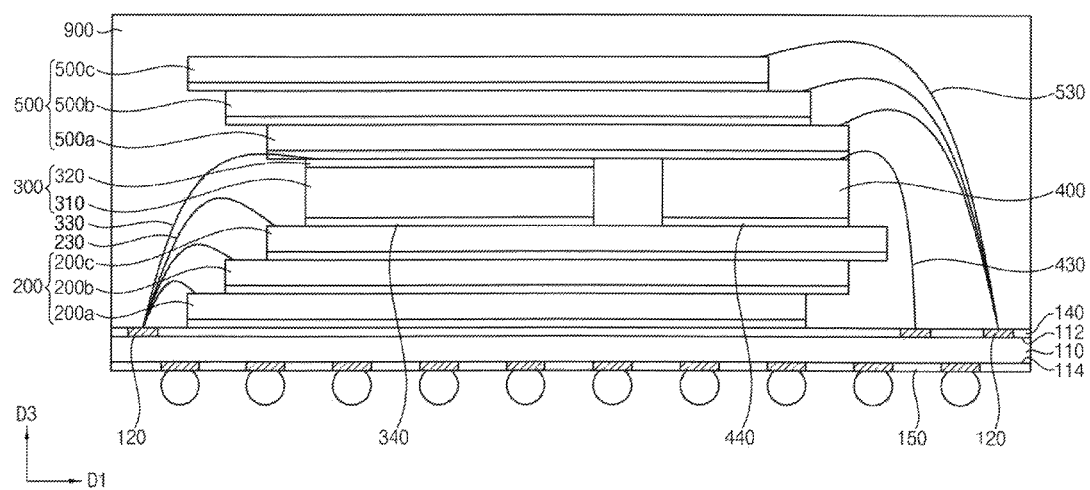

FIG. 20 is a cross-sectional view illustrating a semiconductor package in accordance with example embodiments. The semiconductor package may be substantially the same as or similar to the semiconductor package as described with reference to FIGS. 1 to 6, except for an arrangement of a capacitor structure. Thus, same reference numerals will be used to refer to the same or like elements and any further repetitive explanation concerning the above elements will be omitted.

Referring to FIG. 20, a semiconductor package 102 may include a package substrate 110, a plurality of first semiconductor chips 200, a capacitor structure 300, a second semiconductor chip 400, a plurality of third semiconductor chips 500 and a molding member 900.

In example embodiments, a plurality of the first semiconductor chips 200 may be stacked on the package substrate 110. The first semiconductor chips 200a, 200b and 200c may be adhered on the package substrate 110 by adhesive members 240a, 240b, and 240c, respectively. For example, adhesive member 240a may adhere the first semiconductor chip 200a to the package substrate 110, adhesive member 240b may adhere the first semiconductor chip 200b to the first semiconductor chip 200a, and adhesive member 240c may adhere the first semiconductor chip 200c to the first semiconductor chip 200b. The first semiconductor chip 200 may be electrically connected to the package substrate 110 by first conductive connection members 230. In some embodiments, the first conductive connection members 230 may electrically connect a chip pad of the first semiconductor chip 200 to the substrate pad 120 of the package substrate 110.

The capacitor structure 300 may be stacked on the uppermost first semiconductor chip 200c of the plurality of the first semiconductor chips 200. The capacitor structure 300 may be adhered on the uppermost semiconductor chip 200c by an adhesive member 340. The capacitor structure 300 may include a semiconductor substrate 310 and at least one decoupling capacitor 320 formed in an upper surface of the semiconductor substrate 310.

The capacitor structure 300 may be electrically connected to the package substrate 110 by second conductive connection members 330. Capacitor pads of the capacitor structure 300 may be electrically connected to the substrate pads 120 of the package substrate 110 by the second conductive connection members 330.

The second semiconductor chip 400 may be stacked on the uppermost first semiconductor chip 200c of the plurality of the first semiconductor chips 200 and may be spaced apart from the capacitor structure 300. For example, the second semiconductor chip 400 may be spaced apart from the capacitor structure 300 in a first direction D1. The second semiconductor chip 400 may be adhered on the uppermost semiconductor chip 200c by an adhesive member 440. The adhesive member 440 may have substantially the same thickness as that of the adhesive member 340, and may be formed of the same material as adhesive member 340.

The second semiconductor chips 400 may be electrically connected to the package substrate 110 by third conductive connection members 430. The third conductive connection members 430 may electrically connect a chip pad of the second semiconductor chip 400 to the substrate pad 120 of the package substrate 110.

A thickness of the capacitor structure 300 may be determined to be substantially the same as a thickness of the second semiconductor substrate 400. For example, a height of the capacitor structure 300 in the third direction D3 may be substantially the same as the height of the second semiconductor substrate 400 in the third direction D3. Accordingly, the upper surface of the second semiconductor chip 400 may be coplanar with the upper surface of the capacitor structure 300.

A plurality of the third semiconductor chips 500 may be stacked on the capacitor structure 300 and the second semiconductor chip 400. The third semiconductor chips 500 may be mounted on and supported by the uppermost semiconductor chip 200c by the capacitor structure 300. The third semiconductor chips 500a, 500b and 500c may be adhered on the capacitor structure 300 by adhesive members 540a, 540b, and 540c, respectively. For example, adhesive member 240a may be disposed on the capacitor structure 300 and the second semiconductor chip 400, the third semiconductor chip 500a may be disposed on the adhesive member 240a, the adhesive member 240b may be disposed on the third semiconductor chip 500a, the third semiconductor chip 500b may be disposed on the adhesive member 240b, the adhesive member 240c may be disposed on the third semiconductor chip 500b, and the third semiconductor chip 500c may be disposed on the adhesive member 240c.

The molding member 900 may be formed on the package substrate 110 to protect the first semiconductor chips 200, the capacitor structure 300, the second semiconductor chip 400 and the third semiconductor chips 500 from the surrounding environment.

The method of manufacturing the semiconductor package may be iterated to manufacture semiconductor packages including logic devices and memory devices. For example, the semiconductor package may include logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a package substrate having an upper surface and a lower surface and including a plurality of substrate pads formed on the upper surface;
a capacitor structure arranged on the upper surface of the package substrate and including a semiconductor substrate and at least one decoupling capacitor formed in an upper region of the semiconductor substrate;
a plurality of first semiconductor chips mounted on the package substrate and supported by the capacitor structure;
a second semiconductor chip arranged on the upper surface of the package substrate, the second semiconductor chip being spaced apart from the capacitor structure;
first conductive connection members electrically connecting chip pads of the first semiconductor chips to the plurality of substrate pads; and
second conductive connection members electrically connecting capacitor pads of the at least one decoupling capacitor to the plurality of substrate pads,
wherein a thickness of the second semiconductor chip is the same as a thickness of the capacitor structure,
wherein the first semiconductor chips are mounted on the capacitor structure and the second semiconductor chip using an adhesive film that is in contact with the capacitor structure and the second semiconductor chip,
wherein the at least one decoupling capacitor is a plurality of decoupling capacitors each including respective capacitor pads, the plurality of decoupling capacitors are formed on the semiconductor substrate to be electrically isolated from each other, and the plurality of decoupling capacitors are electrically connected to the respective capacitor pads, and
wherein the second conductive connection members include bonding wires that electrically connect the respective capacitor pads to the respective substrate pads.

2. The semiconductor package of claim 1, wherein the decoupling capacitor comprises at least one of a metal-oxide-semiconductor type capacitor, a cell type capacitor and a metal wiring type capacitor formed on the semiconductor substrate.

3. The semiconductor package of claim 1, wherein a subset of the plurality of decoupling capacitors are electrically connected to the package substrate.

4. The semiconductor package of claim 1, wherein the capacitor structure has a height of from about 10 µm to about 800 µm.

5. The semiconductor package of claim 1, wherein the capacitor pads are provided on an upper surface of the capacitor structure.

6. The semiconductor package of claim 1, wherein the first conductive connection members include bonding wires.

7. A semiconductor package, comprising:
a package substrate;
a first semiconductor chip mounted on the package substrate;
a capacitor structure arranged on the package substrate to be spaced apart from the first semiconductor chip and including a semiconductor substrate and at least one decoupling capacitor formed in an upper surface of the semiconductor substrate;
a plurality of second semiconductor chips mounted on the capacitor structure and the first semiconductor chip using an adhesive film that is in contact with the capacitor structure and the first semiconductor chip and supported by the capacitor structure and the first semiconductor chip; and
conductive connection members electrically connecting capacitor pads of the at least one decoupling capacitor to a substrate pad of the package substrate,
wherein a thickness of the first semiconductor chip is the same as a thickness of the capacitor structure,
wherein the at least one decoupling capacitor is a plurality of decoupling capacitors each including respective capacitor pads, the plurality of decoupling capacitors are formed on the semiconductor substrate to be isolated from each other, and the plurality of decoupling capacitors are electrically connected to the respective capacitor pads, and
wherein the conductive connection members include bonding wires that electrically connect the respective capacitor pads to the respective substrate pads.

8. The semiconductor package of claim 7, wherein the decoupling capacitor comprises at least one of a metal-oxide-semiconductor type capacitor, a cell type capacitor and a metal wiring type capacitor formed on the semiconductor substrate.

9. The semiconductor package of claim 7, wherein:
the first semiconductor chip is one of a plurality of first semiconductor chips stacked on the package substrate,
wherein the plurality of first semiconductor chips are positioned between the package substrate and a lowermost second semiconductor chip of the plurality of the second semiconductor chips.

10. A semiconductor package, comprising:
a package substrate having an upper surface and including a plurality of substrate pads formed on the upper surface;
a capacitor structure arranged on the upper surface of the package substrate and including a semiconductor substrate and at least one decoupling capacitor formed in an upper surface of the semiconductor substrate;
a first semiconductor chip mounted on the package substrate to be spaced apart from the capacitor structure;
a plurality of second semiconductor chips mounted on the capacitor structure and the first semiconductor chip and supported by the capacitor structure and the first semiconductor chip;
first conductive connection members electrically connecting first chip pads of the first semiconductor chip to the plurality of substrate pads;
second conductive connection members electrically connecting second chip pads of the plurality of second semiconductor chips to the plurality of substrate pads; and
third conductive connection members electrically connecting capacitor pads of the at least one decoupling capacitor to the plurality of substrate pads, wherein an upper surface of the capacitor structure is at a same vertical level as an upper surface of the first semiconductor chip, wherein a lower surface of the capacitor structure is at a same vertical level as a lower surface of the first semiconductor chip, wherein the at least one decoupling capacitor is a plurality of decoupling capacitors each including respective capacitor pads, the plurality of decoupling capacitors are formed on the semiconductor substrate to be electrically isolated from each other, and the plurality of decoupling capacitors are electrically connected to the respective capacitor pads, and wherein the third conductive connection members include bonding wires that electrically connect the respective capacitor pads to the respective substrate pads.

11. The semiconductor package of claim 10, wherein a thickness of the first semiconductor chip is the same as a thickness of the capacitor structure.

12. The semiconductor package of claim 10, further including:

a third semiconductor chip arranged on the upper surface of the package substrate, the third semiconductor chip being spaced apart from the capacitor structure and the first semiconductor chip.

13. The semiconductor package of claim 12, wherein a thickness of the third semiconductor chip is the same as a thickness of the capacitor structure and the same as a thickness of the first semiconductor chip.

* * * * *